United States Patent
Vasudevan et al.

(10) Patent No.: US 12,035,483 B2
(45) Date of Patent: Jul. 9, 2024

(54) PRINTED CIRCUIT BOARD ASSEMBLY PROCESS USING MULTIPLE SOLDERS AND ASSEMBLED BOARDS MADE USING THE SAME

(71) Applicant: DELL PRODUCTS L.P., Round Rock, TX (US)

(72) Inventors: Subramanian Vasudevan, Cedar Park, TX (US); Edward Rhem, Leander, TX (US); Philip Conde, Austin, TX (US); Wallace Ables, Georgetown, TX (US); Edwin C. Tinsley, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 698 days.

(21) Appl. No.: 16/839,798

(22) Filed: Apr. 3, 2020

(65) Prior Publication Data
US 2021/0315107 A1    Oct. 7, 2021

(51) Int. Cl.
*H05K 3/34*         (2006.01)
*B23K 1/00*         (2006.01)
(Continued)

(52) U.S. Cl.
CPC ......... *H05K 3/3494* (2013.01); *B23K 1/0016* (2013.01); *B23K 35/262* (2013.01);
(Continued)

(58) Field of Classification Search
None
See application file for complete search history.

(56) References Cited

U.S. PATENT DOCUMENTS 4,807,021 A * 2/1989 Okumura ........... H01L 24/11
                                            257/E23.021
5,131,584 A * 7/1992 Boitel ............... H01L 24/75
                                            257/E21.705
(Continued)

FOREIGN PATENT DOCUMENTS

WO    WO-2014082100 A1 *  5/2014  ......... B23K 35/0244

OTHER PUBLICATIONS

Choudhury et al., "High Reliability Mid-temperature Pb-Free Alloy for Multi-Step Soldering", Electronics Packaging Technology Conference, IEEE, 2017 (Year: 2017).*

(Continued)

*Primary Examiner* — Devang R Patel
(74) *Attorney, Agent, or Firm* — Egan, Enders & Huston LLP.

(57) ABSTRACT

Board assembly processes are disclosed that may be implemented using multiple different electrically conductive solder types to assemble or attach different electronic components to a printed circuit board (PCB). For example, multiple different electronic components may be attached to a common PCB using a multiple-step assembly process that may be performed at different solder reflow temperatures and/or which may incorporate multiple different solder types having different respective minimum reflow temperatures (i.e., melting point temperatures). The disclosed processes may be implementing using a variety of different forms of solder, such as solder paste form, wire solder form, ingot solder form, etc.

23 Claims, 9 Drawing Sheets

(51) Int. Cl.
*B23K 35/26* (2006.01)
*B23K 101/42* (2006.01)

(52) U.S. Cl.
CPC ......... *H05K 3/3421* (2013.01); *H05K 3/3489* (2013.01); *B23K 2101/42* (2018.08)

(56) References Cited

U.S. PATENT DOCUMENTS

| | | | | |
|---|---|---|---|---|
| 5,167,361 | A * | 12/1992 | Liebman | H05K 3/3415 228/173.3 |
| 5,598,036 | A * | 1/1997 | Ho | H05K 3/3436 257/737 |
| 6,333,563 | B1 * | 12/2001 | Jackson | H01L 23/49833 361/779 |
| 6,432,744 | B1 * | 8/2002 | Amador | H01L 24/11 257/E21.511 |
| 6,618,938 | B1 * | 9/2003 | Alagaratnam | H01L 23/49833 29/840 |
| 7,042,088 | B2 * | 5/2006 | Ho | H01L 24/81 257/E23.021 |
| 9,111,793 | B2 * | 8/2015 | Pharand | H01L 24/14 |
| 9,893,043 | B2 * | 2/2018 | Chen | H01L 25/0657 |
| 10,547,310 | B2 | 1/2020 | Casparian et al. | |
| 2004/0235287 | A1 * | 11/2004 | Inoue | H05K 3/3452 257/E21.503 |
| 2006/0043603 | A1 * | 3/2006 | Ranade | H01L 24/81 257/E21.511 |
| 2014/0281618 | A1 | 9/2014 | Sultenfuss et al. | |

OTHER PUBLICATIONS

3 Main Types of PCB Materials, Types of Materials Used for PCB Fabrication, Twistedtraces.com, Printed from Internet Feb. 1, 2020, 1 pg.
Wikipedia, "Ball Grid Array", Printed from Internet Feb. 1, 2020, 7 pgs.
Das, "BGA Soldering & Repairing/How to Solder Ball Grid Array (BGA SMD)", Electronicsandyou.com, Aug. 2019, 2 pgs.
Wikipedia, "Interposer", Printed from Internet Feb. 1, 2020, 2 pgs.
Intel, "Ball Grid Array (BGA) Packaging", Packaging Databoook, 2000, 32 pgs.
Richey, "A Survey and Tutorial of Dielectric Materials Used in The Manufacture of Printed Circuit Boards", Circuitree Magazine, 1999, 10 pgs.
Toleno et al., "Process And Assembly Methods for Increased Yield of Package on Package Devices", 2008, 6 pgs.
Toleno et al., "Process and Assembly Methods for Increased Yield of Package on Package Devices", IPC Printed Circuits Expo, APEX and the Designers Summit, 2008, 32 pgs.

* cited by examiner

PRINTED CIRCUIT BOARD ASSEMBLY PROCESS USING MULTIPLE SOLDERS AND ASSEMBLED BOARDS MADE USING THE SAME

FIELD OF THE INVENTION

This application relates to electronic boards and, more particularly, to board assembly processes.

BACKGROUND

As the value and use of information continues to increase, individuals and businesses seek additional ways to process and store information. One option available to human users is information handling systems. An information handling system generally processes, compiles, stores, and/or communicates information or data for business, personal, or other purposes thereby allowing human users to take advantage of the value of the information. Because technology and information handling needs and requirements vary between different human users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific human user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The current industry standard conventional board assembly process uses a single solder paste alloy application process for the attachment of all components to the printed circuit board (PCB). Examples of such components include a ball grid array (BGA) package such as a central processing unit (CPU) package and other components that are attached to a motherboard of an information handling system. With a single solder paste alloy application process, all components are exposed to a common reflow oven temperature profile. For example, the most commonly used lead free solder paste alloy is SAC 305 which has a minimum reflow temperature (i.e., melting point temperature) of 220° C. and a peak process temperature of 260° C. This conventional board assembly process results in all of the components being attached to the PCB being subjected to process temperatures of 235° C. to 260° C. This reflow temperature range can cause damage to any component packages that are temperature-sensitive and cannot stand such temperatures, for example, due to excessive warpage and creation of open or low reliability solder joints at these temperatures.

It has been proposed to use a Low Temperature Solder (LTS) paste that melts at much lower reflow temperatures than SAC 305 for an entire board assembly process, without changes to the component surface finish, and for assembly of all components on the PCB. Under this proposal, all components will be attached to the board using process reflow temperatures less than 200° C. and using only full LTS solder joints of LTS solder paste attached to a LTS solder ball, i.e., only LTS solder is used and process temperature remains below 200° C. during attachment of all components to the PCB.

Some circuit commodities and BGA suppliers (e.g., graphics card suppliers, memory module suppliers, MOSFET suppliers) only recommend use of SAC 305 solder paste for attachment of their components to a PCB. Therefore, using LTS solder paste to assemble all components of a PCB requires a full LTS qualification validation for each of the different components. Further, solder paste volume control is a key factor to keeping a Bi ratio that may be required for LTS solder joints by component suppliers. In the conventional proposed solution, LTS solder paste is printed using one stencil and solder paste, and different LTS solder paste volumes are required for different component types.

FIG. 1 illustrates a conventional single step and single solder paste board assembly process flow 100 using the same conventional SAC 305 solder paste for attaching all components to the entire board assembly at temperatures of 235° C. to 260° C. In step 102, SAC 305 solder paste is printed onto electrically conductive copper pads on the primary side of a PCB. In step 104, all primary side components (e.g., CPU BGA packages, graphics processing unit "GPU" packages, dynamic random access memory "DRAM" memory module packages, etc.) are pick and placed onto the primary side of the PCB with their solder balls or electrically conductive component leads aligned and in contact with corresponding solder paste-coated copper pads on the PCB. The entire PCB board and all components being attached are then heated in step 106 to a solder paste reflow temperature of 235° C. to 260° C. to melt the SAC 305 solder paste and reflow the SAC 305 solder paste and attach all placed components to the primary side of the PCB. In step 108, any needed secondary side board assembly processing is performed using SAC 305 solder paste on the secondary side of the PCB that is disposed opposite to the primary side of the PCB and the entire PCB board (including both primary and secondary sides of the PCB and all components being attached to both primary and secondary sides of the PCB) is then again heated in step 106 to a solder paste reflow temperature of 235° C. to 260° C. to melt and reflow the SAC 305 solder paste on both primary and secondary sides of the board and attach the placed components to the secondary side of the PCB. Then, final inspection and test of the assembled PCB is performed in step 110.

FIG. 2 illustrates a conventional single solder paste LTS board assembly process flow 200 that has been proposed and that uses a single LTS solder paste for attaching all components to the entire board assembly at a solder paste reflow temperature that is less than 200° C., and the process temperature remains below 200° C. during the entire process flow 200 for attachment of all components to the PCB, and during process flow 200 the PCB and attached components are never exposed to temperatures of 200° C. and above. In step 202, a PCB and associated assembly material is prepared. In step 204, LTS solder paste is printed onto electrically conductive copper pads on the primary side of the PCB, and the applied solder paste is inspected in step 206. In step 208, all primary side components are then placed (using a pick and place technique) onto the primary side of the PCB with their SAC solder balls or component leads aligned and in contact with corresponding LTS solder paste-coated copper pads on the PCB. Next, in step 212, the entire PCB is heated to a LTS solder paste reflow temperature less than 200° C. to reflow the LTS solder paste and attach all placed components at the same temperature to the primary side of the PCB.

Still referring to FIG. 2, LTS solder paste is then printed (if needed) onto electrically conductive copper pads on the opposite secondary side of the PCB in step 214, and the applied LTS solder paste on the secondary PCB side is then inspected in step 216 (in the case that it has been applied). When LTS solder paste has been applied to the secondary PCB side, any secondary side components are placed and the entire PCB board is then again heated in step 218 to a LTS solder paste reflow temperature less than 200° C. to reflow the LTS solder paste and attach all secondary side components at the same temperature to the secondary side of the PCB. In step 220, an automated optical inspection (AOI) is then performed on the assembled PCB of step 218 to visually determine if any solder or component placement defects exist in the assembled PCB. Assuming no defects are found in step 220, then a functional test (FCT) and final inspection is performed in step 224 before packing and shipping the assembled PCB in step 226 to a customer or other party for further assembly of the PCB with other components. If any solder or component placement defects are found by the AOI of step 220, then the current PCB fails the AOI and is subjected to appropriate repair and rework in step 222 prior to proceeding to step 224 for test and final inspection and completion of process 200 as described before.

SUMMARY OF THE INVENTION

Disclosed herein are board assembly processes that may be implemented using multiple different electrically conductive solders to assemble or attach different electronic components (e.g., including associated electronic circuitry) to a printed circuit board (PCB). In one embodiment, multiple different electronic components may be attached to a common PCB using a multiple-step assembly process that may be performed at different solder reflow temperatures and/or which may incorporate multiple different solder types having different respective minimum reflow temperatures (i.e., melting point temperatures). As used herein with reference to a given solder, the term "minimum reflow temperature" means the melting point temperature of the given solder. The disclosed processes may be implementing using a variety of different forms of solder, such as solder paste form, wire solder form, ingot solder form, etc.

In one embodiment, a first portion of one or more electronic components may be assembled to a PCB in a first assembly step using a first solder having a first minimum reflow temperature (i.e., first melting point temperature) by exposing the PCB and first solder to a temperature that is at or above the first minimum reflow/melting point temperature (e.g., in one embodiment from 15° C. to 20° C. above the first minimum reflow/melting point temperature) to reflow the first solder and form one or more solder joints that attach the first portion of electronic components to one or more respective first attachment points (e.g., electrically conductive metal pads) on the PCB. In a second assembly step, a second and different portion of one or more electronic components may then be assembled to the same PCB in a second assembly step using a second and different solder having a second minimum reflow temperature (i.e., second melting point temperature) that is lower than the first minimum reflow/melting point temperature by exposing the PCB to a temperature that is at or above the second minimum reflow/melting point temperature (e.g., in one embodiment from 15° C. to 20° C. above the second minimum reflow/ melting point temperature), and that is below the first minimum reflow/melting point temperature, to reflow the second solder and form one or more solder joints that attach the second portion of electronic components to one or more respective second and different attachment points on the PCB without again reflowing the previously-existing solder joints of the first solder that attach the first portion of electronic components to the PCB.

In this embodiment, one or more optional additional assembly steps may then be successively performed in similar manner to assemble respective additional portions of one or more electronic components to the same PCB by using a current selected solder having a successively lower minimum reflow or melting point temperature than the minimum reflow/melting point temperature of the solder used in the previous step, i.e., by exposing the PCB to a temperature that is at or above the minimum reflow temperature (i.e., melting point temperature) of the current selected solder, and that is below the minimum reflow temperature (i.e., melting point temperature) of any of the selected solders used in the previous assembly steps, to form one or more solder joints that attach each additional portion of the electronic components to one or more additional and different attachment points on the PCB. In this way, it is possible to assemble each successive portion of electronic components to the same PCB without again reflowing the solder of any of the previously-existing solder joints that now attach the previously-assembled electronic components to the PCB. In one embodiment, this advantageously allows different electronic components (e.g., having different temperature tolerance and/or solder compatibility characteristics) to be assembled to the same PCB in different respective assembly steps that employ different temperatures and different solders.

In one example of the above-described embodiment, a multi-solder board assembly process may be accomplished by selecting multiple different solder alloys or any other suitable multiple solders for sequential attachment of multiple different sets of electronic components to the same PCB in successively lower temperature heating steps. Each solder alloy may be selected for attaching a different set of the electronic components based on the selected solder alloy reflow temperature compatibility with the temperature tolerance of its selected set of electronic components, and each different set of electronic components may be attached to the PCB using its respective selected solder alloy in a heating step that is separate from the heating step used for attaching the other sets of electronic components with their respective selected solder alloys.

Such a multi-solder board assembly process may start by first selectively applying a first solder alloy or any other suitable solder that melts at a first minimum reflow or melting point temperature to a first set of locations on a PCB for a first set of electronic components that can tolerate temperatures at or above the first minimum reflow/melting point temperature, placing all of the first set of electronic components in contact with the first solder alloy on the PCB, and then reflowing the first solder alloy at a first process temperature that is at or above the minimum reflow or melting point temperature of the first solder alloy to reflow the first solder alloy and attach the first set of electronic components to the first set of locations on the PCB. A second solder or any other suitable solder that melts at a second and lower minimum reflow or melting point temperature may then be selectively applied to a second set of locations on the PCB for a second set of components that can tolerate the second minimum reflow/melting point temperature of the second solder allow, but that cannot tolerate the first minimum reflow or melting point temperature of the first solder alloy. All of the second set of electronic components may be placed in contact with the second solder alloy on the PCB, and the second solder alloy may then be reflowed at a second process temperature that is below the minimum reflow or melting point temperature of the first solder alloy but that is at or above the minimum reflow/melting point temperature of the second solder alloy to reflow the second solder alloy and attach the second set of electronic components to the second set of locations on the PCB.

The process of this example may be optionally repeated in similar manner to attach additional sets of successively lower temperature tolerant electronic components to different respective locations on a PCB using successively lower process temperatures. In this way, temperature-sensitive electronic components may be processed and attached to the same PCB at acceptable process temperatures without reflowing the solders used to attach other electronic components that have been previously attached to the same PCB at higher process temperatures.

In another embodiment, one or more electronic components may be assembled to a PCB using a hybrid solder joint that is formed by a combination of at least two different solder types, e.g., which may have different minimum reflow temperatures (i.e., melting point temperatures). For example, a first solder (e.g., one or more solder balls) having a first minimum reflow or melting point temperature may be first attached to the electronic component (e.g., by heating the first solder to a temperature above the first minimum reflow/melting point temperature). A second solder (e.g., a solder paste or other form of solder such as solid solder wire or solder ingot layer) having a second minimum reflow or melting point temperature that is lower than the first minimum reflow or melting point temperature may then be placed in mechanical physical contact between the first solder and one or more attachment points on the PCB. The PCB may then be heated to a temperature that is at or above the second minimum reflow/melting point temperature, and that is below the first minimum reflow or melting point temperature, to form a hybrid solder joint of the first and second solders that attaches the electronic components to the PCB.

In a further optional embodiment, one or more electronic components may be similarly assembled to a PCB using a hybrid solder joint that is formed by a combination of three or more different solder types, e.g., which may have different minimum reflow temperatures (i.e., melting point temperatures). In such an optional embodiment, each current successive solder type may be reflowed while in mechanical physical contact with a previous solder type at a temperature that is at or above the minimum reflow temperature (i.e., melting point temperature) of the current successive solder type and that is lower than the minimum reflow temperature (i.e., melting point temperature) of the previous solder type, with the last successive solder type being in mechanical physical contact with an attachment point on the PCB.

In one exemplary embodiment, the disclosed processes may be implemented to accommodate temperature sensitivity of given electronic components, without sacrificing strength or degrading reliability of solder joints formed for other less temperature-sensitive or higher temperature-tolerant electronic components on the PCB. In one exemplary embodiment, the disclosed processes may be employed using at least one relatively lower minimum reflow temperature (i.e., melting point temperature) solder (e.g., LTS) to attach a temperature-sensitive electronic component (e.g., such as a central processing unit (CPU) ball grid array (BGA) package that is susceptible to thermal warpage at relatively higher solder reflow temperatures) to the PCB (e.g., such as a motherboard) using a relatively lower solder reflow temperature process step, and only after other electronic components (e.g., such as graphics chip or graphics processing unit "GPU" package, memory module (e.g., DRAM), discrete components such as transistors, capacitors, resistors, inductors, connectors, etc.) have been attached or otherwise assembled to the same PCB at a relatively higher solder reflow temperature in a separate process step using at least one relatively higher minimum reflow temperature (i.e., melting point temperature) solder (e.g., such as SAC 305). In this way, relatively lower minimum reflow temperature solder (e.g., such as LTS solder) may be used to successfully join a PCB at relatively lower solder reflow temperatures with an electronic component of a type that is otherwise susceptible to thermal warpage or damage at relatively higher solder reflow temperatures, while the other electronic components are assembled with higher strength and reliability to the same PCB at relatively higher solder reflow temperatures using relatively higher minimum reflow temperature (i.e., melting point temperature) solder (e.g., such as SAC 305).

The disclosed multiple step board assembly process may be implemented in one embodiment to utilize relatively lower melting temperature LTS solder only for assembly of more temperature-sensitive electronic components to a PCB, without affecting the quality and reliability of other higher temperature-tolerant electronic components which may be previously assembled on the same PCB assembly in at least one different step with a second and different relatively higher melting temperature solder (e.g., such as SAC 305). In one exemplary embodiment, multiple different types of solder paste (e.g., relatively higher melting temperature SAC 305 solder paste and relatively lower melting temperature LTS solder paste) may be employed during different respective steps of a multiple step board assembly process in a manner that limits presence of the LTS solder paste to only those board locations corresponding to more temperature-sensitive electronic components. In one example, a solder dip paste transfer method may be employed for a more temperature-sensitive BGA package electronic component to accurately control coverage of the LTS solder paste so that it is only present on the BGA balls of the BGA package.

With suitable solder application, the disclosed multiple solder/multiple reflow step process allows circuitry of a PCB to be first partially assembled using at least one relatively higher melting temperature solder (e.g., such as SAC 305) in a first assembly step to attach all higher temperature-tolerant electronic components to the PCB, followed by at least one additional lower temperature solder assembly step for optimized attachment of only those more temperature-sensitive electronic components to the PCB using a relatively lower melting temperature solder (e.g., such as LTS solder) to minimize thermal warpage or damage to the more temperature-sensitive electronic components. In this way, optimum reliability attachment may be achieved for all components in the final PCB assembly.

Use of at least two different solders (e.g., different solder pastes) allows relatively lower melting point temperature solder (e.g., such as LTS solder) to be used only as needed for attaching more temperature-sensitive component electronic components (e.g., such as a CPU BGA package) to a PCB at relatively lower temperatures that are below the melting point of conventional higher melting point solder (e.g., such as SAC 305 solder), while no changes are required to the use of conventional higher melting point temperature solder (e.g., such as SAC 305 solder) and associated conventional assembly steps for assembling all other electronic components that are tolerant of higher temperatures to the same PCB at relatively higher temperatures required for the higher melting point temperature solder. This may be implemented in some embodiments to achieve increased overall PCB reliability as compared to PCBs that are assembled with similar electronic components using only relatively lower melting point solder (e.g., LTS solder) and using only relatively lower reflow temperatures that are less than the higher melting point temperature of conventional higher melting point temperature solder (e.g., such as SAC 305).

In one embodiment, attachment of more temperature-sensitive electronic components (e.g., such as CPU BGA packages) to a PCB (e.g., such as a motherboard) may be performed on a surface mount technology (SMT) production line using a second pass LTS reflow combined with any suitable controlled solder paste application process, e.g., such as a solder dip process, a mini stencil paste printing process, a jet printing process, a solder paste dispense process, a solder paste jetting process, etc. Using this process technique, a first portion of electronic components may be initially assembled and attached with higher temperature solder joints to a PCB in a first pass using a first solder that may be for example a standard higher melting point temperature solder (e.g. SAC 305 solder), and then a second portion of electronic components may be selectively attached with lower temperature solder joints to the PCB in a second pass using a second and lower melting point temperature solder (e.g., LTS solder) during a secondary reflow process at a lower process reflow temperature that does not reflow the solder joints of the first portion electronic components that were initially assembled to the PCB using the first pass higher melting point temperature solder paste. In one embodiment, such a multiple step board assembly process may be implemented with a currently-qualified surface mount technology (SMT) assembly process by only applying the lower melting point temperature solder (e.g., LTS solder) at lower temperature for attachment of more temperature sensitive electronic components, and without changing the current qualified higher temperature SMT assembly process and higher melting point temperature solder (e.g. SAC 305 solder) used to attach the higher temperature-tolerant electronic components.

In a further embodiment, a third portion of electronic components may optionally be next selectively attached to the PCB in a third pass using a third solder having a lower minimum reflow temperature (i.e., melting point temperature) than the first and second solders (e.g., a second and different type of LTS solder having a lower minimum reflow temperature or melting point temperature than the LTS solder of the second pass) in a tertiary reflow process that does not reflow the solder joints of the first and second portion electronic components that were previously assembled to the PCB using the respective first and second pass higher melting point temperature solders. Any number of additional portions of electronic components may be similarly attached with additional different solders (e.g., different LTS solders) in respective additional reflow passes, with each successive portion of components being attached at a successively lower reflow temperature using a different solder having a respective successively lower minimum reflow temperature (i.e., melting point temperature) than the solders of all preceding passes such that all previous solder joints do not reflow again.

In one embodiment, most electronic components of a printed circuit board assembly "PCBA" (e.g., other than a high thermal warpage-susceptible BGA package) may be first assembled to the board material of the PCB separately from the high thermal warpage-susceptible BGA package using a standard SAC 305 solder paste and reflow process. Then, during a second process step, LTS paste may first be applied to either electrical contacts (e.g., electrically conductive copper pads) of the PCB itself (e.g., by screen printing), or to electrical contacts (e.g., conductive solder balls) of the high thermal warpage-susceptible BGA package (e.g., by screen printing or dipping the balls in LTS paste). The high thermal warpage-susceptible BGA package may then be placed on the PCB and subjected to a second and lower LTS reflow temperature to melt the balls of the BGA package to attach the high thermal warpage-susceptible BGA package to the PCB. In this way, the disclosed multiple step process may be employed to yield a standard SAC 305-soldered PCB that also has localized LTS solder joints to attach the high thermal warpage-susceptible BGA package to the PCB. This multiple step process reduces or eliminates warpage of the high thermal warpage-susceptible BGA package during assembly to the board of the PCB (e.g., according to BGA package vendor specifications), while at the same time ensuring that no LTS solder joints are present to decrease quality and/or increase reliability risk to other higher temperature-tolerant components soldered to the PCB since these other higher temperature-tolerant electronic components are soldered with higher strength standard SAC 305 solder (rather than LTS solder) to the board of the PCB.

In one respect, disclosed herein is a method including: positioning a first solder between and in contact with one or more electrical contacts of a first electronic component and one or more mating first electrical contacts of a printed circuit board (PCB); then heating the first solder to a first temperature to reflow the first solder; then allowing the reflowed first solder to cool to form one or more first solder joints attaching the electrical contacts of the first electronic component to the first electrical contacts of the PCB; then positioning a second solder in contact with one or more electrical contacts of a second electronic component and one or more mating second electrical contacts of the PCB; then heating the second solder to a second temperature that is lower than the first temperature to reflow the second solder without reflowing the first solder joints; and then allowing the reflowed second solder to cool to form one or more second solder joints attaching the electrical contacts of the second electronic component to the second electrical contacts of the PCB.

In another respect, disclosed herein is an apparatus including: a printed circuit board (PCB); a first electronic component having one or more electrical contacts attached to one or more mating first electrical contacts of the PCB by one or more respective first solder joints disposed between the electrical contacts of the first electronic component and the mating first electrical contacts of the PCB, the first solder joints including a first solder having a first melting point temperature; and a second electronic component having one or more electrical contacts attached to one or more mating second electrical contacts of the PCB by one or more respective second solder joints disposed between the electrical contacts of the second circuit component and the mating second electrical contacts of the PCB, the second solder joints including a second solder having a second melting point temperature that is less than the first melting point temperature of the first solder.

DESCRIPTION OF ILLUSTRATIVE EMBODIMENTS

Figure 1:
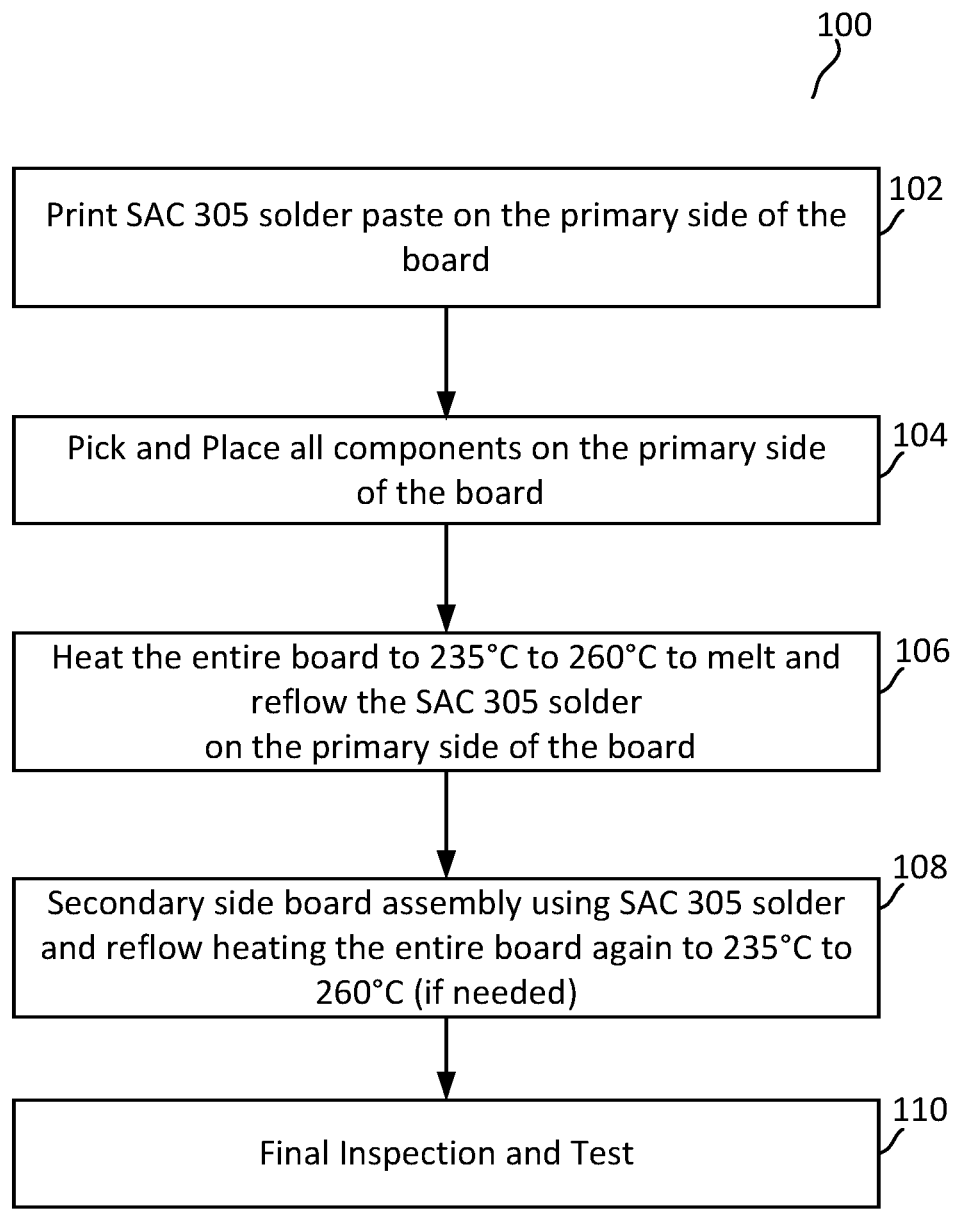
FIG. 1 illustrates a conventional single step and single solder board assembly process flow.
Figure 2:
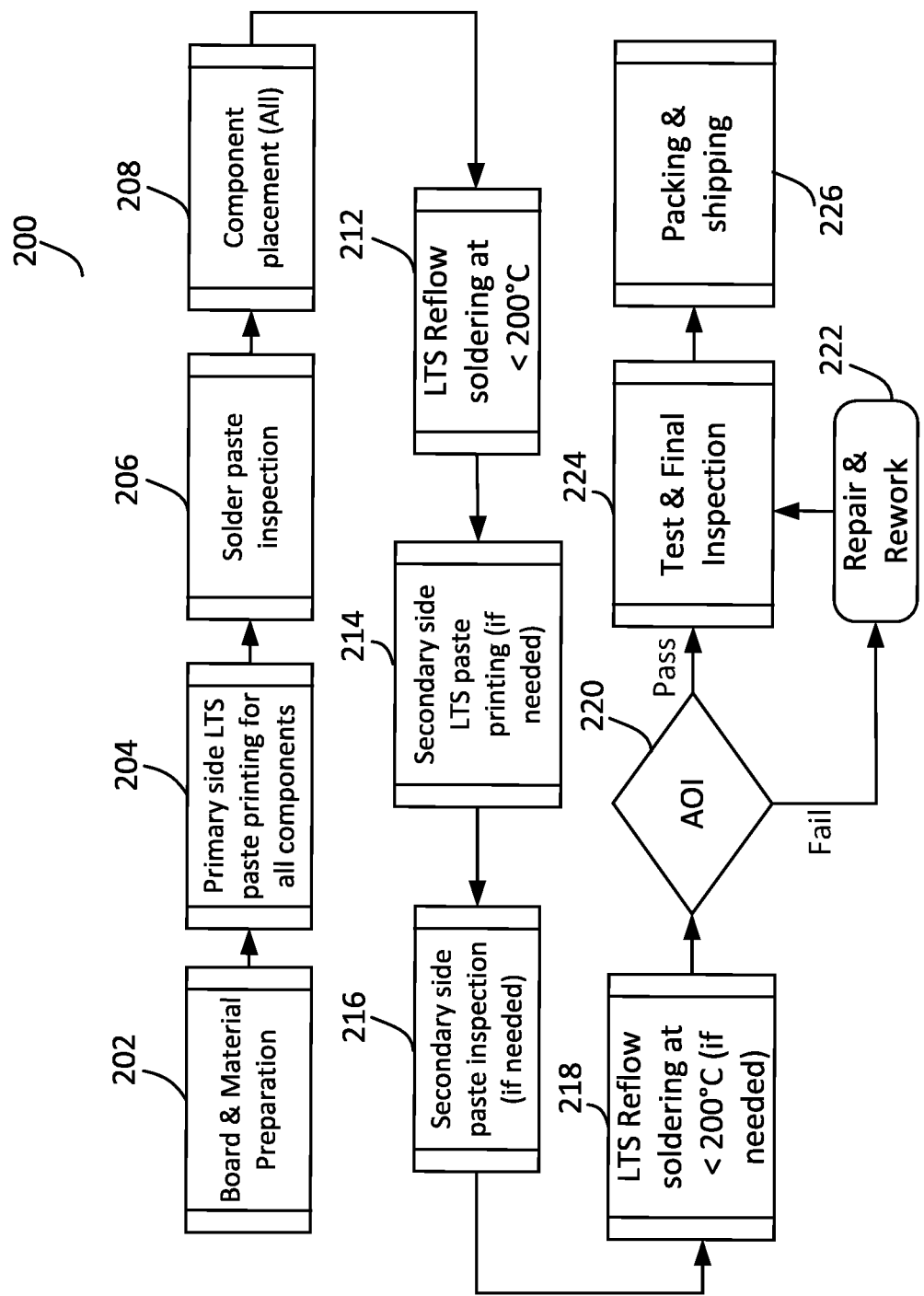
FIG. 2 illustrates a conventional single step and single solder board assembly process flow.
Figure 3:
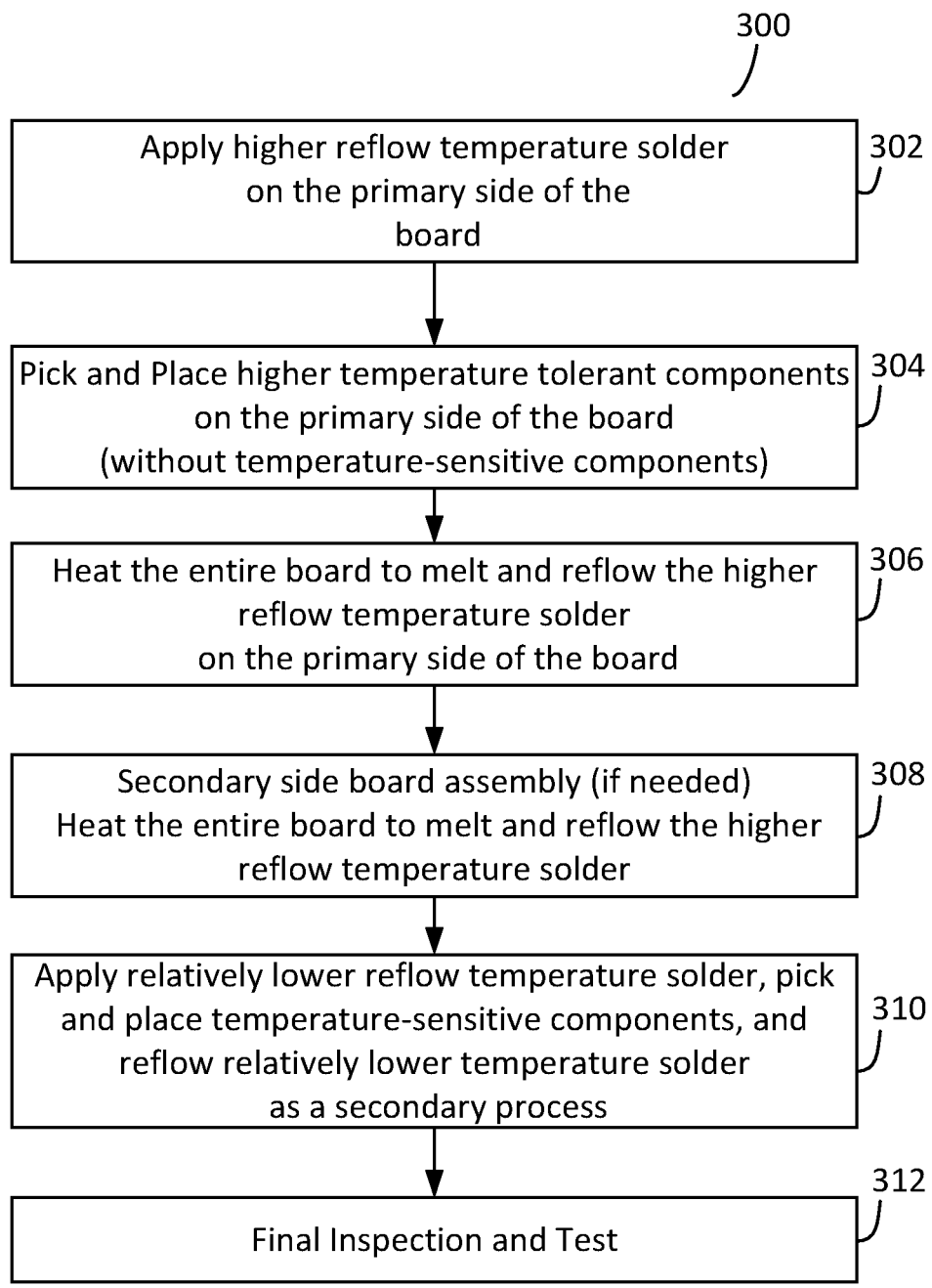
FIG. 3 illustrates a multiple step board assembly process flow according to one exemplary embodiment of the disclosed systems and methods.

FIG. 3 illustrates one embodiment of a multiple step board assembly process flow 300 that may be implemented using a first relatively higher reflow temperature solder reflow process step to assemble higher temperature-tolerant electronic components to a PCB with relatively higher minimum reflow temperature (i.e., melting point temperature) solder (e.g., such as SAC 305), followed by a second relatively lower reflow temperature solder reflow process step to assemble one or more temperature-sensitive electronic components (e.g., such as a CPU BGA package or other type of electronic component package having temperature sensitivity) to the same PCB with a relatively lower minimum reflow temperature (i.e., melting point temperature) solder (e.g., LTS solder). Examples of CPU BGA packages include, but are not limited to, CPU BGA packages available from manufacturers such as Intel, Advanced Micro Devices (AMD), etc. Other types of electronic components may be BGA packages, packages having electrically conductive component leads rather than electrically conductive solder balls, etc. The disclosed multiple step solder approach may be implemented in one exemplary embodiment to reduce or eliminate warpage or other damaging effects to temperature-sensitive electronic components without affecting quality and reliability provided by the higher temperature solder joints used for assembling the other higher temperature-tolerant electronic components to the same PCB.

Although certain solder reflow steps and techniques are described herein in relation to exemplary electrically conductive solder pastes, it will be understood that the disclosed multiple solder type and/or multiple solder reflow methodology described herein may alternatively be employed using other forms of electrically conductive solder (e.g., ingot solder form, wire solder form, etc.), and that different forms of solder may be employed for different steps, e.g., such as ingot solder form in a first step, wire solder form in a second step, etc.

Process 300 of FIG. 3 begins in step 302, where a selected relatively higher minimum reflow temperature or melting point solder (e.g., such as conventional SAC 305 solder paste or other type of solder paste) is positioned (e.g., applied) for reflow attachment of one or more higher temperature-tolerant electronic components (e.g., such as graphics chip or GPU package, memory module (e.g., DRAM), discrete components such as transistors, capacitors, resistors, inductors, connectors, etc.) to a first portion of electrical contacts in the form of electrically conductive copper pads on the primary side of the PCB that correspond to desired mounted positions of a first set of higher temperature-tolerant electronic components on the PCB. Such higher temperature-tolerant electronic components may be characterized in one embodiment as not being susceptible to thermal warpage or other thermal damage at the solder reflow temperature required or otherwise to be employed for the selected relatively higher minimum reflow temperature or melting point solder (e.g., a reflow temperature of 200° C. or greater, or a reflow temperature of 220° C. or greater in the case of SAC 305 solder as described below).

For example, relatively higher minimum reflow temperature (i.e., melting point temperature) solder paste may be applied (e.g., screen printed) onto a first portion of electrically conductive copper pads on a primary side of a PCB that correspond to the final desired mounted positions of the first set of higher temperature-tolerant electronic components, or printing the solder paste directly onto the solder balls or other electrically-conductive contacting surfaces of the first set of higher temperature-tolerant electronic components. Other suitable solder paste application methods include, but are not limited to, dipping solder balls or other electrically-conductive contacting surfaces (e.g., electrically-conductive component leads) of the first set of higher temperature-tolerant electronic components in the relatively higher minimum reflow temperature (i.e., melting point temperature) solder paste.

In step 304, the first set of higher temperature-tolerant electronic components (i.e., excluding temperature-sensitive electronic components such as thermal warpage-susceptible package/s) are then pick and placed onto the primary side of the PCB with a surface of their electrically-conductive contacts (e.g., copper pads) aligned and in contact with a corresponding first portion of copper pads on the PCB with respective solder balls and the applied relatively higher minimum reflow temperature (i.e., melting point temperature) solder of step 302 positioned therebetween. The PCB board is then heated in step 306 to a solder reflow temperature that is appropriate to reflow the selected relatively higher minimum reflow temperature (i.e., melting point temperature) solder of step 302, followed by cooling to solidify the relatively higher minimum reflow temperature (i.e., melting point temperature) solder to form solder joint/s to attach the placed first set of higher temperature-tolerant electronic components to the primary side of the PCB, e.g., in one exemplary embodiment by virtue of a homogenous SAC solder joint formed by SAC solder balls and SAC solder paste between the conductive pads of the PCB and each of the higher temperature-tolerant electronic components.

In one embodiment, the PCB may be heated in step 306 to greater than or equal to a minimum reflow temperature (i.e., melting point temperature) of the selected relatively higher minimum reflow temperature solder paste of step 302, e.g., a temperature greater than or equal to 200° C. For an embodiment in which the selected relatively higher minimum reflow temperature solder paste is SAC 305, the PCB may be heated in step 306 to a SAC 305 minimum reflow temperature (i.e., melting point temperature) of 220° C. or to a greater temperature selected for process optimization, e.g., from 220° C. to 260° C., alternatively from 230° C. to 245° C., etc. After heating of step 306, the PCB may be cooled to below the minimum reflow temperature (i.e., melting point temperature) of the selected relatively higher minimum reflow temperature solder paste of step 302 to solidify the solder to form solder joint/s to attach the placed first set of higher temperature-tolerant electronic component/s.

In optional step 308, any required optional higher temperature secondary side board assembly processing is performed on the side of the PCB that is disposed opposite to the primary side of the PCB, e.g., by repeating steps 302 to 306 for the secondary side board assembly using a selected relatively higher minimum reflow temperature (i.e., melting point temperature) solder (e.g., such as SAC 305) to assemble to the secondary side of the board a different set of higher temperature-tolerant electronic components that are not susceptible to thermal warpage or other damage at the required solder reflow temperature of the selected relatively higher minimum reflow temperature (i.e., melting point temperature) solder.

Next, in step 310, a relatively lower minimum reflow temperature solder (e.g., LTS solder paste alloy type such as Sn—Bi—Ag, Cu and other proprietary dopants of varying amounts, Sn—Zn based solders, Sn—In based solders, etc.) having a melting point temperature less than the relatively higher minimum reflow temperature (i.e., melting point temperature) solder of step 302 is then applied for reflow attachment of second set of one or more temperature-sensitive electronic components (e.g., such as a CPU BGA package) to a second portion of electrically conductive copper pads on the primary side of the PCB. Such temperature-sensitive electronic components may be further characterized in one embodiment as components that experience BGA board warpage or other damage when exposed to the solder reflow temperature of step 306 and optional step 308 as described above. In step 310, the relatively lower minimum reflow temperature (i.e., melting point temperature) solder may be positioned (e.g., applied) to the primary side PCB conductive pads and/or to the solder balls (e.g., LTS or SAC solder balls) of the BGA package using any suitable method, e.g., such as by screen printing or jet printing the relatively lower minimum reflow temperature (i.e., melting point temperature) solder paste onto the copper pads on the primary side of the PCB, by screen printing or jet printing the relatively lower minimum reflow temperature (i.e., melting point temperature) solder paste onto the solder balls of the BGA package, by dipping the solder balls of a BGA package (e.g., with a spatula) into the relatively lower minimum reflow temperature (i.e., melting point temperature) solder paste, by dispensing a relatively lower minimum reflow temperature (i.e., melting point temperature) solder paste one at a time onto the conductive pads or solder pads from a syringe, etc. The second set of temperature-sensitive components are then pick and placed onto the primary side of the PCB with their electrically-conductive contacting surfaces (e.g., LTS or SAC solder balls) aligned and in contact with the corresponding second portion of copper pads on the PCB with the applied relatively lower minimum reflow temperature (i.e., melting point temperature) solder therebetween.

The PCB is then heated (e.g., by application of hot air and/or in oven) in step 310 to a solder reflow temperature that is less than the minimum reflow temperature (i.e., melting point temperature) of the solder/s of steps 306 and 308, and that is appropriate to reflow the selected relatively lower minimum reflow temperature (i.e., melting point temperature) solder of step 310 (e.g., from a minimum reflow temperature of 150° C. to a temperature of less than 220° C., alternatively from a minimum reflow temperature of 150° C. to a temperature of less than 200° C., and alternatively from 160° C. to 190° C. for LTS solder such as Sn—Bi—Ag solder), followed by cooling the PCB below the minimum reflow temperature (i.e., melting point temperature) of the relatively lower minimum reflow temperature (i.e., melting point temperature) solder to form solder joint/s to attach the placed second set of higher temperature-tolerant electronic components to the primary side of the PCB, e.g., by virtue of a hybrid or heterogeneous SAC and LTS solder joint in the case of SAC solder balls and LTS solder paste, or a homogenous LTS solder joint in the case of LTS solder balls and LTS solder paste, between the conductive pads of the BGA PCB and each of the higher temperature-tolerant electronic components. Step 310 is performed as a separate and distinct step only after steps 302 to 308 are completed, and the PCB board has cooled, e.g., to a temperature below 150° C. Final testing and inspection (e.g., FCT) of the assembled PCB board is then performed in step 312.

Figure 4:
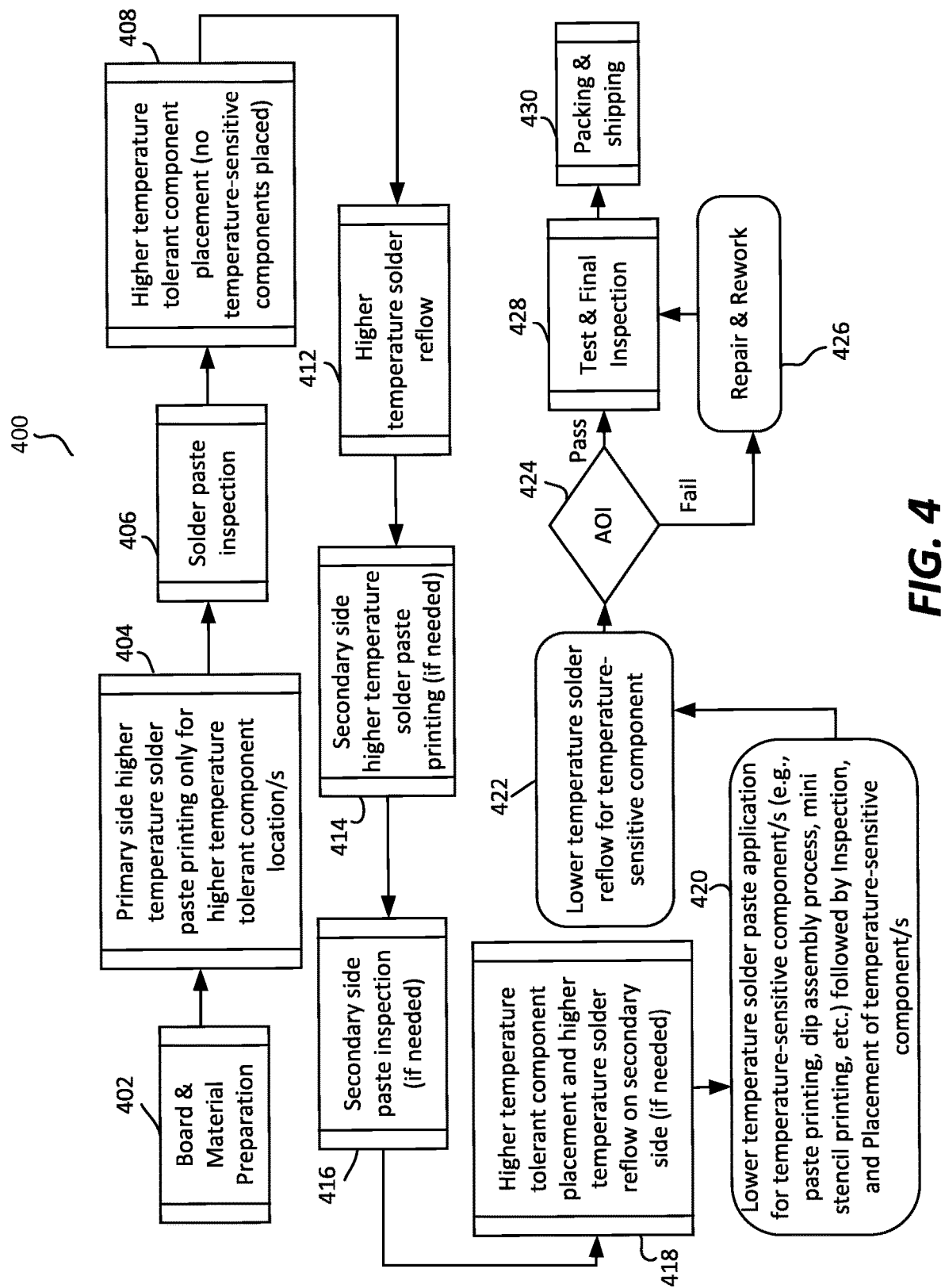
FIG. 4 illustrates a multiple step board assembly process flow according to one exemplary embodiment of the disclosed systems and methods.

FIG. 4 illustrates further details of one particular exemplary embodiment of a multiple step board assembly process flow 400 described below in reference to the illustrated embodiment of FIGS. 5A to 5E. Process 400 begins in step 402 where a PCB 500 and other material (e.g., solder paste, BGA package/s, other types of electronic components such as quad flat no-lead (QFN) package/s, capacitor/s, resistor/s, connector/s and other components, etc.) to be assembled to PCB 500 are prepared by surface mount technology (SMT) equipment. PCB 500 may be, for example, a motherboard for an information handling system that is composed of etched conductive (e.g., copper) circuitry, including electrically conductive pads 510, that are disposed on a planar base such as glass reinforced epoxy laminate sheet (e.g., FR-4 board material) having a thickness of from 0.2 millimeter to 3.5 millimeters. Other suitable types of materials for PCB 500 include, but are not limited to, sheets of polytetrafluoroethylene (PTFE or Teflon), flexible polyimide, etc. In the illustrated embodiment of FIG. 5A, PCB 500 is provided with three groups 504a, 504b and 504c of electrically conductive (e.g., copper) pads 510, with each group 504 corresponding to a mounted position of a different electronic component.

Figure 5A:
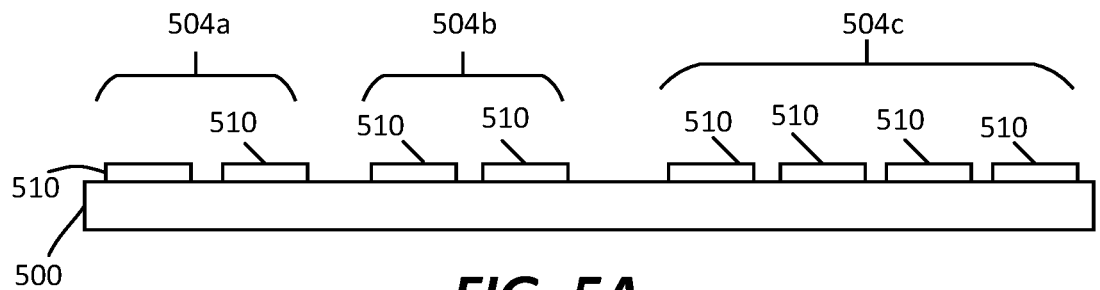
FIG. 5A illustrates a side edge view of a printed circuit board (PCB) configured according to one exemplary embodiment of the disclosed systems and methods.
Figure 5B:
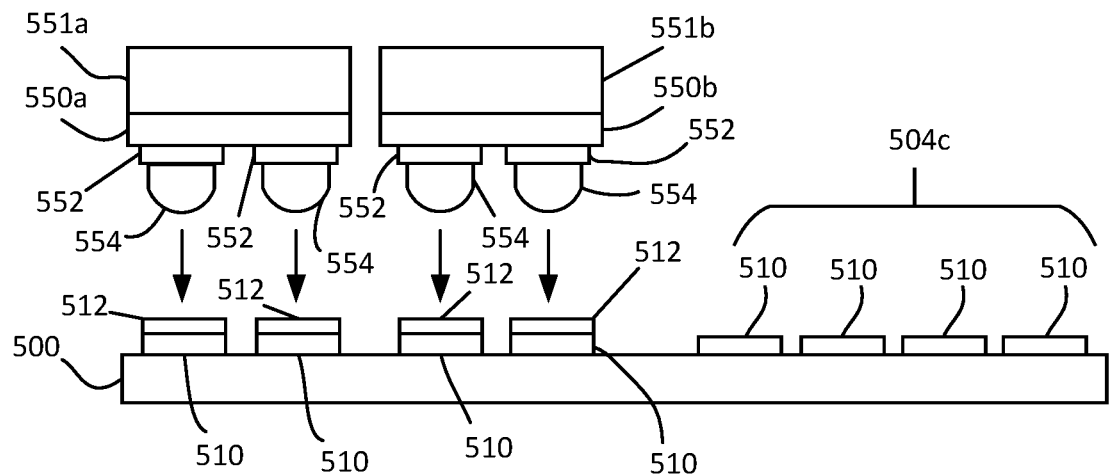
FIG. 5B illustrates a side edge view of a PCB and electronic components during processing according to one exemplary embodiment of the disclosed systems and methods.

In step 404, a layer 512 of relatively higher minimum reflow temperature (i.e., melting point temperature) solder paste (e.g., in this case SAC 305) is screen printed using a paste print machine (e.g., using screen printing head or jet printing head) onto selected conductive pads 510 that correspond to locations 504a and 504b of higher temperature-tolerant BGA package electronic components 551a and 551b that are to be placed on the primary side of the PCB 500 as shown by the arrows in FIG. 5B. The applied solder paste 512 is inspected in step 406.

Higher temperature-tolerant electronic components (e.g., BGA package components in this exemplary embodiment) 551a and 551b are shown in FIG. 5B just prior to pick and place mounting to PCB 500. As shown, each of higher temperature-tolerant BGA package components 551a and 551b include multiple solder balls 554 (e.g., SAC 305 solder balls) that are pre-affixed to respective electrically conductive (e.g., copper) pads 552 disposed in a grid on the surface of a package substrate 550a and 550b of a respective BGA package 551a or 551b, such as by an adhesive or tacky solder flux. Package substrates 550a and 550b for BGA package components 551a and 551b may be composed of a PCB-type material such as FR-4, PTFE, polyimide, etc. having laminated copper circuitry defined thereon and electrically coupled to conducive pads 552. Although exemplary higher temperature-tolerant BGA package components 551a and 551b are illustrated as having package substrates, it will be understood that higher temperature-tolerant electronic components that do not have package substrates (e.g., unitary electronic components) may also be attached to PCB 500 in other embodiments of the practice of the disclosed apparatus and methods. It is also possible that other higher temperature-tolerant electronic components (e.g., such as GPU package, memory module (e.g., DRAM), discrete components such as transistors, capacitors, resistors, inductors, connectors, etc.) may additionally or alternatively be provided for attachment to PCB 500 and coupled to conductive pads 552 (with or without respective package substrates 550 as the case may be) and encapsulated with a molding compound on the side of each package that is opposite from the conductive pads 552.

In one exemplary embodiment, higher temperature-tolerant components (e.g., such as higher temperature-tolerant BGA package components) may be characterized as not being susceptible to thermal warpage and having a thickness greater than or equal to 1.6 millimeters which renders such packages less susceptible to thermal warpage. However, it will be understood that package warpage susceptibility is a function of many factors such as package thickness, package size, die size, die thickness, laminate material, reflow temperature, reflow process time, amount of copper in the laminate, package design, etc. Thus, BGA packages having a thickness of less than 1.6 millimeters may also be higher temperature tolerant in other embodiments.

Figure 5C:
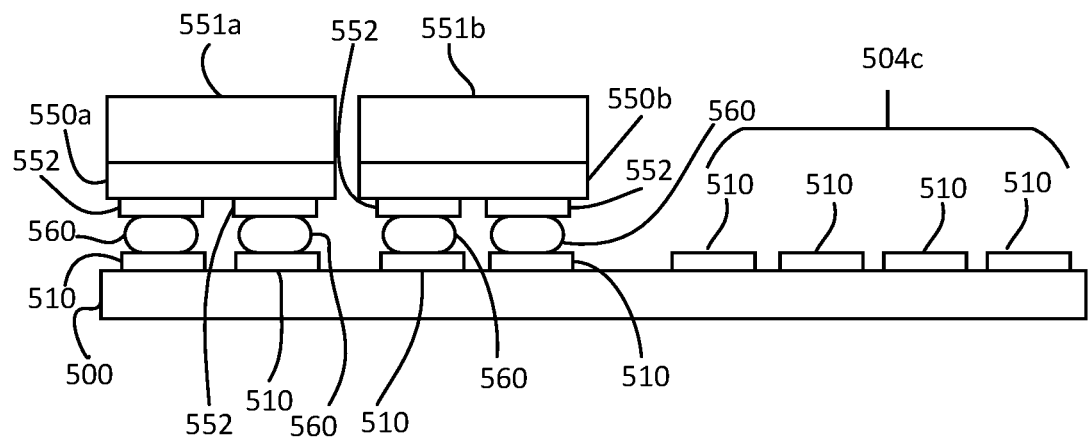
FIG. 5C illustrates a side edge view of a PCB and electronic components during processing according to one exemplary embodiment of the disclosed systems and methods.
Figure 5D:
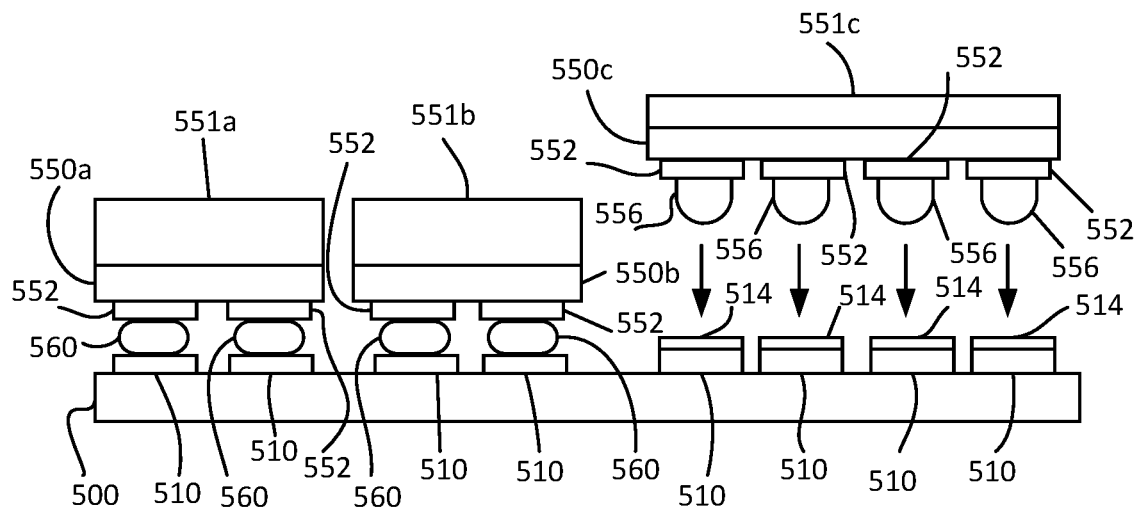
FIG. 5D illustrates a side edge view of a PCB and electronic components during processing according to one exemplary embodiment of the disclosed systems and methods.

Next, in step 408, higher temperature-tolerant BGA package components 551a and 551b (and/or other type/s of higher temperature-tolerant electronic components having solder balls or electrically-conductive leads in some embodiments) are placed (e.g., using a placement machine and pick and place technique) onto the primary side of the PCB 500 with their solder balls 554 aligned and in contact with the corresponding layers 512 of relatively higher minimum reflow temperature (i.e., melting point temperature) solder paste present on copper pads 510 of locations 504a and 504b of PCB 500. This is followed in step 412 by heating of the entire PCB 500 (e.g., using a reflow oven, hot air, etc.) to a SAC solder paste reflow temperature (e.g., greater than or equal to a minimum reflow temperature of 220° C., or to a temperature greater than 220° C., alternatively from 235° C. to 260° C., alternatively from 245° C. to 260° C., alternatively from 240° C. to 245° C.) in a manner as previously described to reflow the SAC solder paste and solder balls 554, followed by cooling below the minimum reflow temperature (i.e., melting point temperature) of the relatively higher minimum reflow temperature solder paste, e.g., to form homogenous SAC solder joints 560 to attach the placed components 551a and 551b to the primary side of the PCB as shown in FIG. 5C.

Figure 6A:
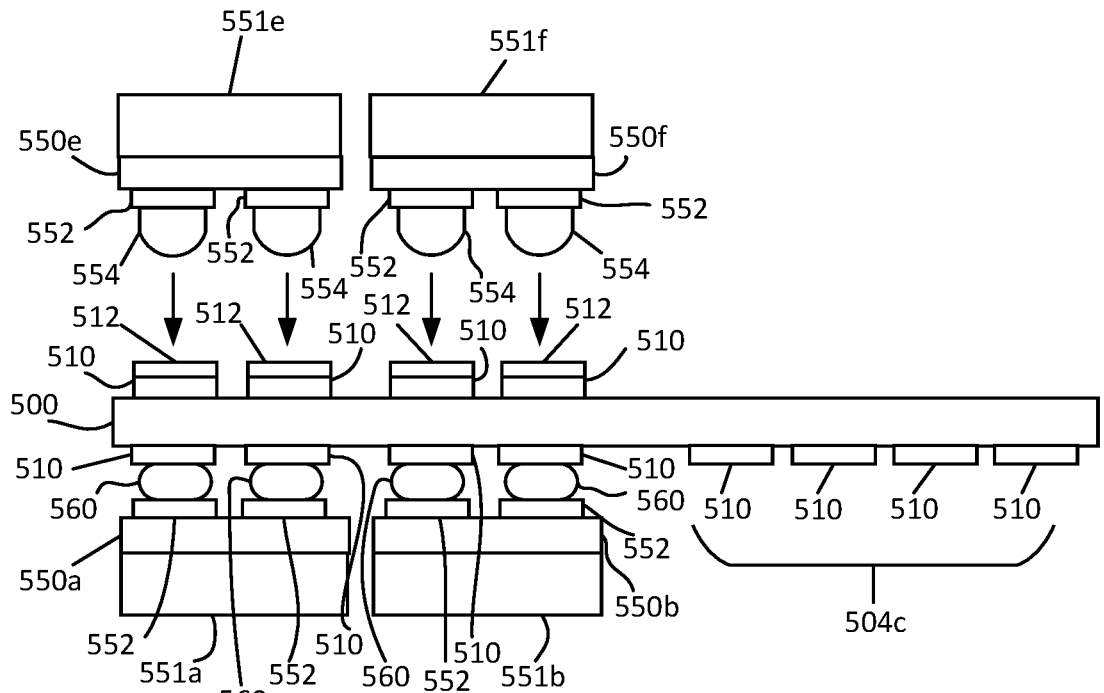
FIG. 6A illustrates a side edge view of a PCB and electronic components during processing according to one exemplary embodiment of the disclosed systems and methods.
Figure 6B:
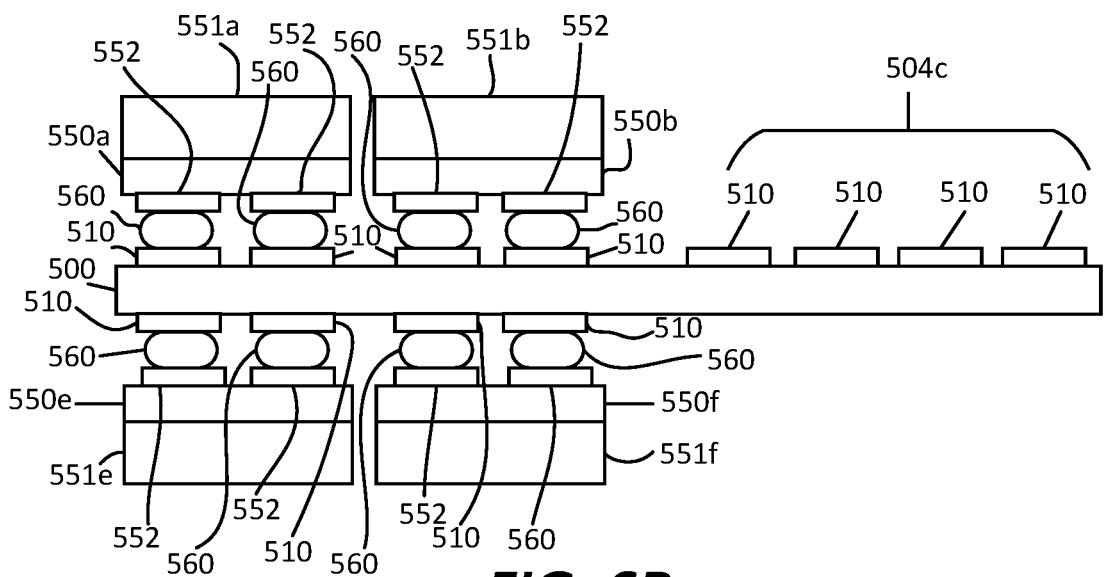
FIG. 6B illustrates a side edge view of a PCB and electronic components during processing according to one exemplary embodiment of the disclosed systems and methods.

Still referring to FIG. 4, PCB 500 may be optionally flipped over and optional steps 414, 416 and 418 may be performed (if needed) to attach additional higher temperature-tolerant BGA package components 551e and 551f (and/or previously described other types of higher temperature-tolerant components in some embodiments) to the opposite secondary side of the PCB 500 as shown in FIGS. 6A and 6B. In particular, a layer 512 of relatively higher minimum reflow temperature (i.e., melting point temperature) solder paste (e.g., SAC 305) may be screen printed in optional step 414 (e.g., similar to step 404) onto selected conductive pads 510 of the secondary side of PCB 500 that correspond to locations of higher temperature-tolerant BGA package electronic components 551e and 551f to be placed on the secondary side of the PCB 500 as shown by the arrows in FIG. 6A. This applied solder paste 512 on secondary side of PCB 500 may be inspected in optional step 416 in similar manner as previously described for step 406.

Figure 6C:
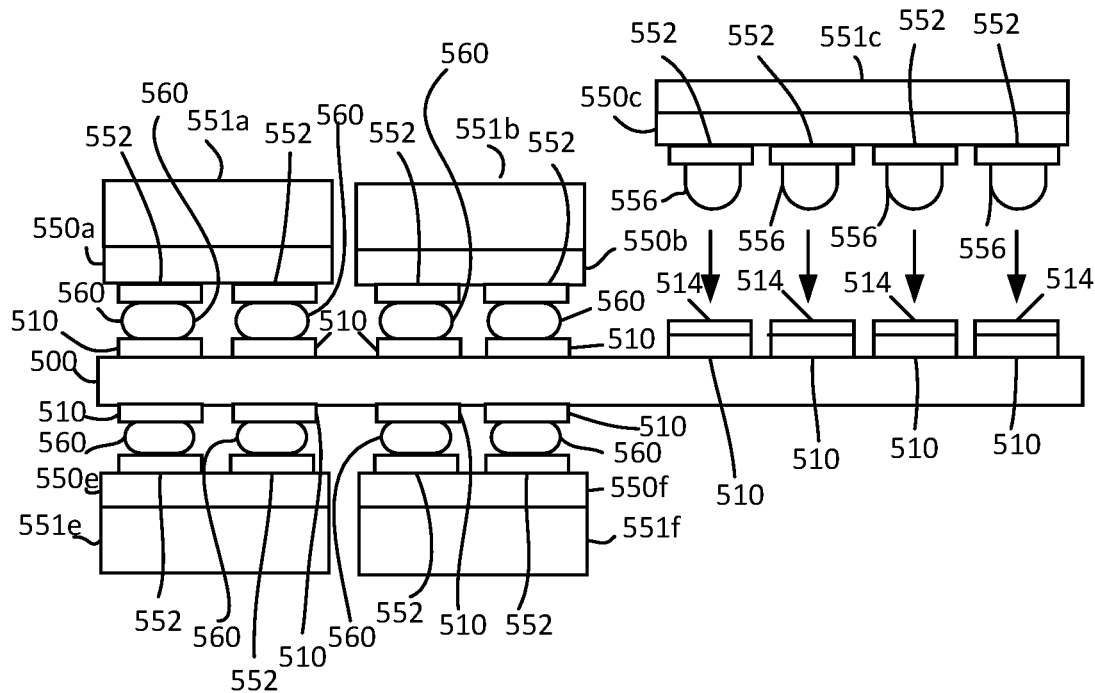
FIG. 6C illustrates a side edge view of a PCB and electronic components during processing according to one exemplary embodiment of the disclosed systems and methods.

In optional step 418, higher temperature-tolerant BGA package components 551e and 551f (and/or other types of previously described higher temperature-tolerant electronic components in some embodiments) may then be placed onto the secondary side of the PCB 500 with their respective solder balls 554 aligned and in contact with the corresponding layers 512 of relatively higher minimum reflow temperature (i.e., melting point temperature) solder paste present on copper pads 510 on secondary side of PCB 500, followed by reflow heating of entire PCB 500 to SAC solder paste reflow temperature (e.g., in similar manner as previously described in steps 408 and 412) to melt and reflow the SAC 305 solder paste on both primary and secondary sides of the board, followed by cooling of the entire PCB. This results in homogenous SAC solder joints 560 to attach the placed components 551e and 551f to the secondary side of the PCB as shown in FIG. 6C. PCB 500 may then be flipped over again for relatively low temperature processing of primary side of PCB 500 in steps 420 and 422 as described below.

Step 420 of FIG. 4 proceeds directly from step 412 unless optional steps 414 to 418 are performed, in which case step 420 proceeds from step 418. In step 420, a layer 514 of relatively lower minimum reflow temperature (i.e., melting point temperature) solder paste (e.g., LTS) having a lower melting point than the relatively higher minimum reflow temperature (i.e., melting point temperature) solder paste (e.g., SAC 305) may be screen printed (e.g., using a mini stencil and paste printing machine with screen printing head or jet printing head) onto open selected conductive pads 510 of the primary side of PCB 500 that correspond to location 504c of at least one thermal temperature-sensitive BGA package component 551c (e.g., a CPU package) with package substrate 550c and pre-affixed solder balls 556 to be placed on the primary side of the PCB 500 as shown by the arrows in FIGS. 5D and 6C. Although exemplary temperature-sensitive BGA package components 551c are illustrated as having package substrates, it will be understood that temperature sensitive electronic components that do not have package substrates (e.g., unitary electronic components having solder balls or electrically-conductive component leads) may also be attached to a PCB 500 in other embodiments of the practice of the disclosed apparatus and methods.

In other alternate embodiments, relatively lower minimum reflow temperature (i.e., melting point temperature) solder paste (e.g., LTS) may be applied in step 420 between the solder balls 556 and conductive pads 510 using any other suitable technique, e.g., by flipping package 551c and screen printing (e.g., using a mini stencil) the relatively lower minimum reflow temperature (i.e., melting point temperature) solder paste onto the solder balls 556 of the BGA package 551c, by using a paste dipping machine to dip the solder balls 556 of the BGA package 551c into the relatively lower minimum reflow temperature (i.e., melting point temperature) solder paste, etc. In one example paste dipping embodiment, a process similar to a Package on Package (PoP) assembly process may be employed to dip solder balls 556 into relatively lower minimum reflow temperature (i.e., melting point temperature) solder paste followed by a relatively lower reflow temperature process step that is lower in temperature than the previous reflow temperature process step/s.

Still referring to step 420, the applied relatively lower minimum reflow temperature (i.e., melting point temperature) solder paste 514 on primary side of PCB 500 may be inspected in step 420 in similar manner as described for step 406. Temperature-sensitive BGA package 551c (and/or other type/s of previously described temperature-sensitive electronic components) may then be placed onto the primary side of the PCB 500 with their respective solder balls 556 (e.g., LTS solder balls or SAC 305 solder balls) aligned and in contact with the corresponding layers 514 of relatively lower minimum reflow temperature (i.e., melting point temperature) solder paste present on open copper pads 510 that correspond to location 504 on primary side of PCB 500 in similar manner as previously described in relation to step 408.

In one exemplary embodiment, temperature-sensitive electronic components (including temperature-sensitive BGA package component 551c) may be characterized as being susceptible to thermal warpage and having a package thickness less than 1.6 millimeters, although it will be understood that package warpage susceptibility is a function of many factors such as package thickness, package size, die size, die thickness, laminate material, reflow temperature, reflow time, amount of copper in the laminate, package design, etc. Thus, BGA packages and other types of electronic components having a thickness of greater than or equal to 1.4 millimeters may also be susceptible to thermal warpage in other embodiments. It will be understood that electronic component temperature sensitivity of temperature-sensitive electronic components may additionally or alternatively be due to individual component characteristics other than warpage.

In one exemplary embodiment, composition of solder balls 556 of temperature-sensitive BGA package 551c may be selected to be relatively lower minimum reflow temperature (i.e., melting point temperature) solder so as to match the reflow temperature and chemistry of a selected relatively lower minimum reflow temperature solder paste 514, and thus result in a homogeneous relatively lower reflow temperature solder joint 570 after relatively lower reflow temperature heating of step 422 described below. In such an exemplary embodiment, a homogenous relatively lower reflow temperature solder joint chemistry provides improved solder joint quality and a more reliable solder joint produced at lower reflow temperatures, e.g., LTS solder reflow temperature is much lower than SAC solder reflow temperature (e.g., about 60° C. less than SAC solder reflow temperature), and use of the LTS reflow temperature reduces the package warpage risk at the lower LTS reflow temperature. However, use of relatively higher minimum reflow temperature (i.e., melting point temperature) solder (e.g., SAC) in combination with solder balls 556 with relatively lower minimum reflow temperature solder paste 514 is alternatively possible, although it may result in a heterogeneous (e.g., LTS/SAC) solder joint after relatively lower reflow temperature processing that is non-homogeneous and thus may have a lower reliability than a homogenous (e.g., all LTS) solder joint.

Figure 5E:
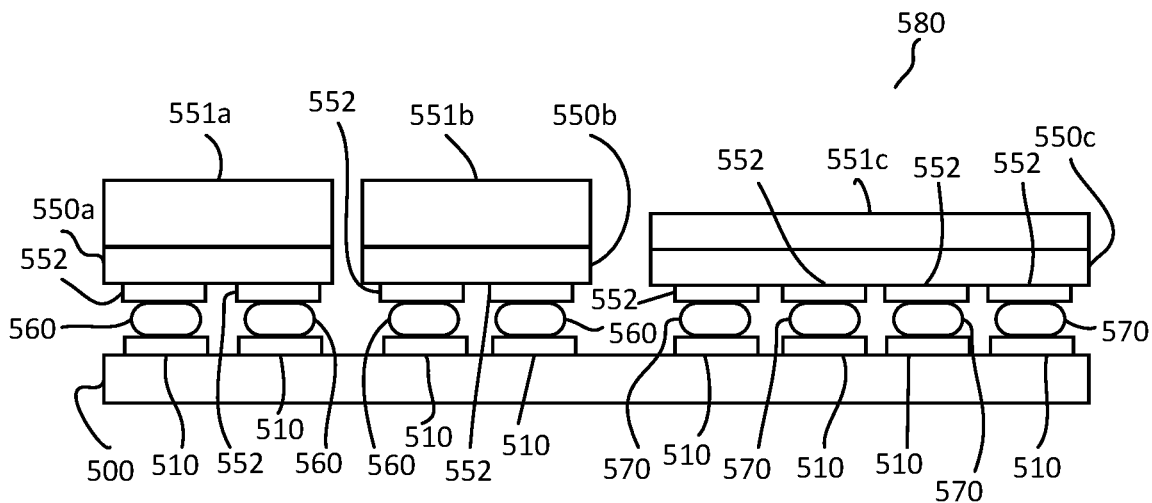
FIG. 5E illustrates a side edge view of an assembled board apparatus according to one exemplary embodiment of the disclosed systems and methods.
Figure 6D:
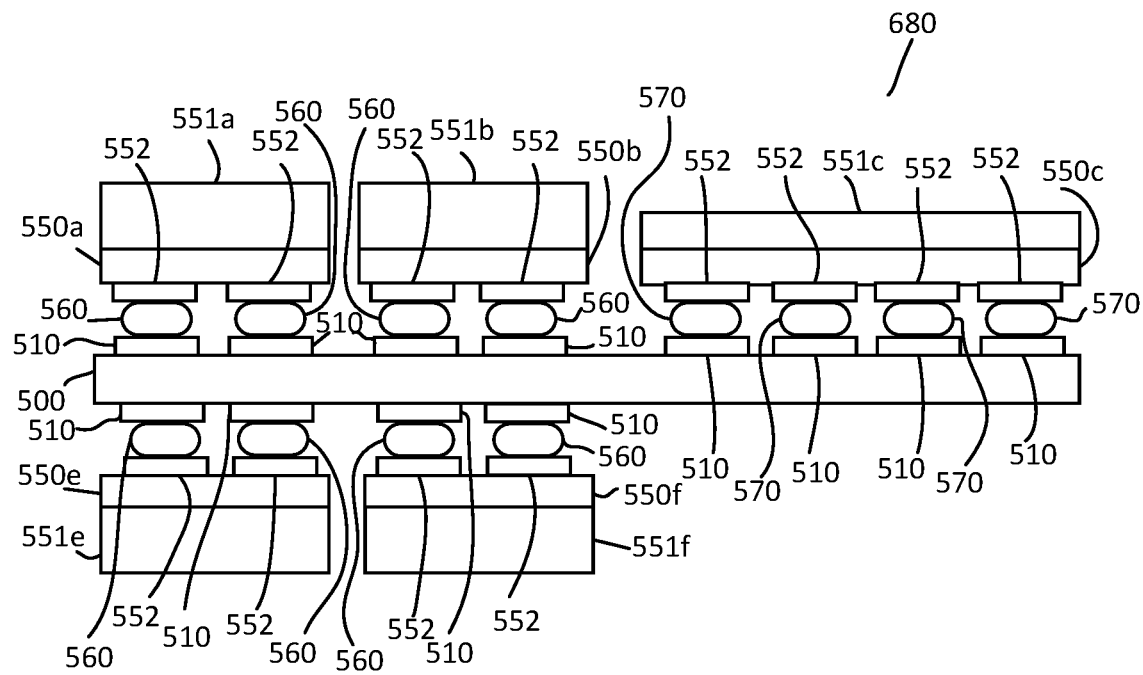
FIG. 6D illustrates a side edge view of an assembled board apparatus according to one exemplary embodiment of the disclosed systems and methods.

Next, in step 422, PCB 500 is heated to a relatively lower reflow temperature solder paste reflow process temperature (e.g., a temperature less than 200° C., alternatively from 150° C. to less than 200° C. and alternatively from 160° C. to 190° C.) in a manner as previously described (e.g., using a reflow oven, by application of hot air, etc.) to reflow the relatively lower minimum reflow temperature (i.e., melting point temperature) solder paste 514 and solder balls 556 to form solder joints 570, followed by cooling below the minimum reflow temperature (i.e., melting point temperature) of the relatively lower minimum reflow temperature solder paste, to attach the placed temperature-sensitive components 551c to the primary side of the PCB to form an assembled board apparatus 580 as shown in FIG. 5E. In one embodiment solder balls 556 of component 551c may be LTS solder balls, in which case the solder joints 570 formed in step 422 will be homogeneous LTS solder joints. In another embodiment, solder balls 556 may be SAC 305 balls, in which case solder joints 570 formed in step 422 will be hybrid or heterogeneous SAC 305 and LTS solder joints. In an alternate embodiment where employing optional steps 414, 416 and 418, step 422 results in an assembled board apparatus 680 as shown in FIG. 6D.

For purposes of example, the processes of FIGS. 3 and 4 reference particular exemplary solders and solder pastes for the process steps described herein. However, in the disclosed process, any type of solder paste may be employed to form solder joints 570 in steps 420 and 422 that has a lower minimum reflow temperature (i.e., melting point temperature) than the minimum reflow temperature (i.e., melting point temperature) of the solder paste previously employed to form solder joints 560 in steps 404 to 418, such that the previously-formed solder joints 560 of steps 404 to 418 do not reflow or otherwise melt during a process of forming solder joints 570 in steps 420 and 422 that is performed at a lower reflow process temperature than the minimum reflow temperature (i.e., melting point temperature) of the solder paste employed to form solder joints 560 in steps 404 to 418. Examples of types of relatively higher minimum reflow temperature (i.e., melting point temperature) solders and solder pastes for steps 404 to 418 include, but are not limited to, SAC solder alloys such as SAC 305, SAC 205, SAC 187, etc., or other leaded or lead-free solder alloys (e.g., including, but not limited to, SAC 307, SAC 405, SnPb 63/37, etc.). Example of types of relatively lower minimum reflow temperature (i.e., melting point temperature) solders and solder pastes for steps 420 to 422 include, but are not limited to, LTS solder paste alloys such as Sn—Bi—Ag, Cu and other proprietary dopants of varying amounts, Sn—Zn based solder alloys, Sn—In based solder alloys, etc.

In another embodiment, at least one additional temperature-sensitive electronic component 551c may be attached in similar manner to an optional additional group of electrically conductive pads 510 that may be provided on the secondary side of the PCB 500. In such an embodiment, PCB 500 may be flipped following step 422, and the additional temperature-sensitive electronic component 551c placed and soldered to PCB 500 using LTS and LTS processing temperature in the same manner described for steps 420 and 422.

Figure 5F:
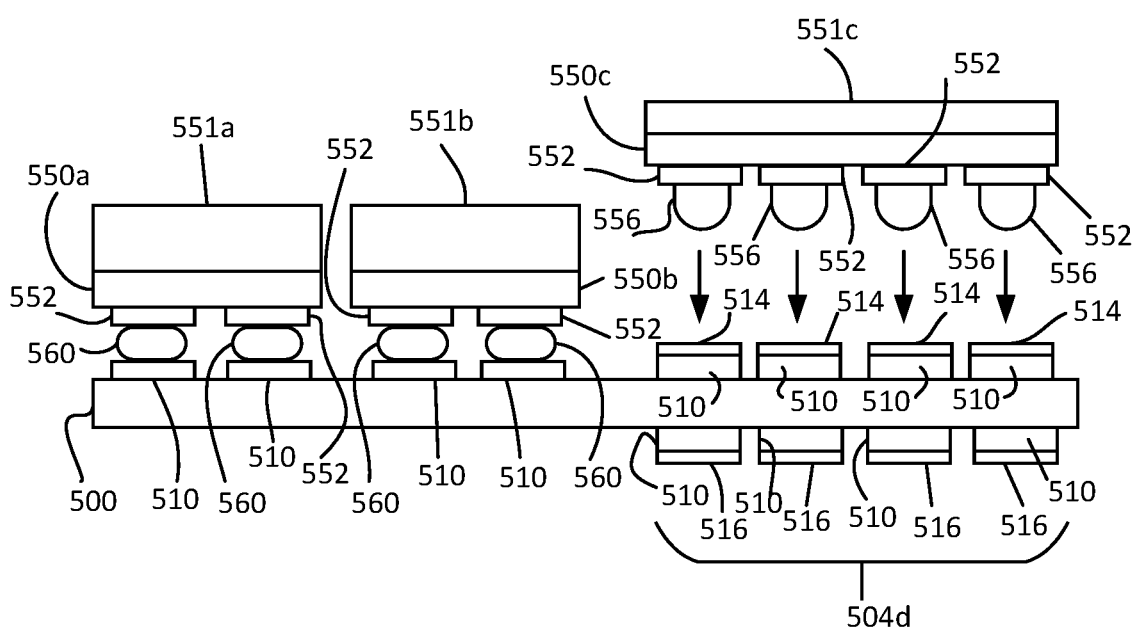
FIG. 5F illustrates a side edge view of a PCB and electronic components during processing according to one exemplary embodiment of the disclosed systems and methods.
Figure 5G:
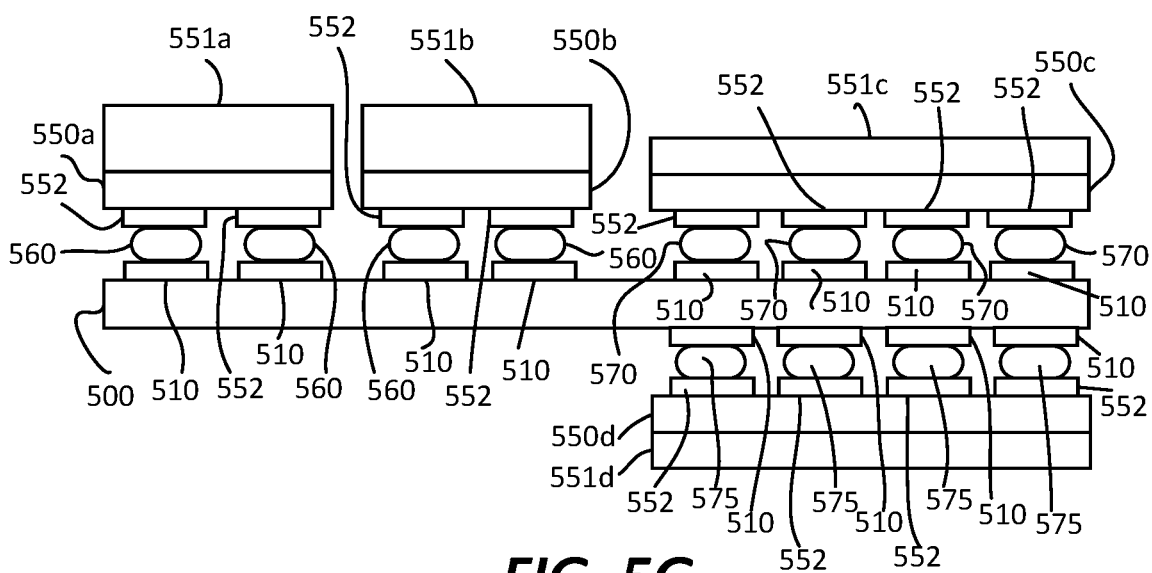
FIG. 5G illustrates a side edge view of an assembled board apparatus according to one exemplary embodiment of the disclosed systems and methods.

In one exemplary embodiment, an optional additional temperature-sensitive or other type of electronic component 551d may be attached with its package substrate 550d to an optional additional group 504d of electrically conductive pads 510 using a different solder paste 516 having a respective successively lower minimum reflow temperature (i.e., melting point temperature) than the solder pastes 512 and 514 of all preceding steps by using a reflow process temperature that is lower than the reflow process temperatures of all preceding steps such that all previously-formed solder joints 560 and 570 do not reflow again during solder paste 516 reflow. This is shown in FIG. 5F, where an additional selected relatively lower minimum reflow temperature solder paste 516 (i.e., having a lower melting point temperature than the melting point temperatures of each of solder pastes 512 and 514) is applied to the additional group of electrically conductive pads 504d, and in FIG. 5G where the additional temperature-sensitive or other type of electronic component 551d is placed with its package substrate 550d and soldered to PCB 500 by forming a relatively lower reflow temperature solder joint 575 in a similar manner described for steps 420 and 422, but this time using a processing temperature that is lower than all preceding solder reflow processing temperatures previously employed to form solder joints 560 and 570. Although not shown flipped in FIGS. 5F and 5G, it will be understood that PCB 500 may be flipped over for the steps of FIGS. 5F and 5G.

Returning to FIG. 4, an automated optical inspection (AOI) may next be optionally performed in step 424 on the assembled PCB of step 422 to visually determine if any solder or component placement defects exist in the assembled PCB apparatus 580 or 680. Assuming no defects are found in step 424 (AOI "Pass"), then an optional functional test (FCT) and final inspection may be performed in step 428 before packing and shipping the assembled PCB to a customer or other party for further assembly of the PCB apparatus 580 or 680 with other components. If any solder or component placement defects are found by the AOI of step 424, then the assembled PCB apparatus 580 or 680 fails the AOI and may be subjected to appropriate repair and rework (e.g., using rework machine and hot gas to melt solder joint and retry) in step 426 prior to proceeding to step 430 for completion of process 400 including, for example, packing and shipping the assembled PCB apparatus 580 or 680 to a facility where the assembled PCB apparatus 580 or 680 is assembled with other components of an information handling system, to a retailer for sales of the assembled PCB apparatus 580 or 680 to end users, etc.

In one embodiment, an assembled board apparatus (e.g., PCB apparatus 580 or 680) that is manufactured by a process disclosed herein may be a motherboard for combination with other components of a desktop or tower computer, a server, a notebook or tablet computer, a convertible computer, etc. Further information on components of information handling systems may be found, for example, in U.S. patent application Ser. No. 15/587,103 filed May 4, 2017, and in United States Patent Application Number 20140281618A1, each of which is incorporated herein by reference in its entirety for all purposes.

It will be understood that board apparatus of FIGS. 5A-5G and 6A-6D are exemplary only, and that other numbers and combinations of components and PCB mounting locations on primary and/or secondary sides of a PCB may be employed. It will also be understood the processes of FIGS. 3 and 4 are exemplary only, and that any number of additional portions of electronic components may be similarly attached in separate and successive steps of placement, solder paste application, reflow heating followed by cooling using successively lower reflow process temperatures (corresponding to successively lower minimum reflow temperature LTS solder pastes) each time such that an additional portion of components (e.g., BGA components) may be attached during each successive reflow process at a respective successively lower reflow process temperature and such that all previously formed solder joints do not reflow again.

Table 1 lists example solders with their corresponding minimum reflow temperatures (i.e., melting point temperatures) which may be employed in multiple successive solder reflow steps of the disclosed processes (with each successive solder reflow step employing a lower minimum reflow temperature category solder than employed by the previous solder reflow step), it being understood that this list is exemplary only, and that other solders may also be employed.

TABLE 1

Example Solders and Corresponding Minimum Reflow Temperatures

| Solder Minimum Reflow Temperature Category (High, Medium or Low) | Solder Name | Solder Minimum Reflow Temperature (i.e., Melting Point Temperature) | Example Solder Reflow Temperature Range During Reflow Process Step |
|---|---|---|---|
| High | SAC 305 | 220° C. | 245-260° C. |
| Medium | Indalloy ® 227 Sn—In—Ag Solder Alloy | 195° C. | 200-210° C. |
| Low | ALPHA ® OM-550 | 150° C. | 160-190° C. |

Table 2 lists an exemplary combination of solders that may be employed in one exemplary embodiment of a multiple step solder reflow process employing more than two reflow steps. As shown in Table 2, after the first step a lower solder reflow temperature is employed during each successive solder reflow step, and the solder reflow temperature of each process step is above the minimum reflow temperature (i.e., melting point temperature) of the current solder and lower than the minimum reflow temperature (i.e., melting point temperature) of the previous step. It will be understood that the particular solders and number of reflow temperatures shown in Table 2 are exemplary only, and that other combinations of additional and/or alternative solder types may be employed in processes that include four or more solder reflow steps.

TABLE 2

Example Multiple Solder Reflow Step Combination

| Reflow Step | Solder Name | Example Solder Reflow Temperature Range During Reflow Process Step |
|---|---|---|
| 1 | SAC 305 | 245-260° C. |
| 2 | Sn—In—Ag Solder Alloy | 200-210° C. |
| 3 | Sn—Bi—Ag LTS solder (similar to Alpha OM550) | 160-190° C. |

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed methods and apparatus may be utilized in various combinations and/or independently. Thus the invention is not limited to only those combinations shown herein, but rather may include other combinations.

What is claimed is:

1. A method, comprising:
 positioning a first solder between and in contact with one or more electrical contacts of a first electronic component and one or more mating first electrical contacts of a printed circuit board (PCB);
 then heating the first solder to a first temperature to reflow the first solder;
 then allowing the reflowed first solder to cool to form one or more first solder joints attaching the electrical contacts of the first electronic component to the first electrical contacts of the PCB;
 then positioning a second solder in contact with one or more electrical contacts of a second electronic component and one or more mating second electrical contacts of the PCB;
 then heating the second solder to a second temperature that is lower than the first temperature to reflow the second solder without reflowing the first solder joints;
 then allowing the reflowed second solder to cool to form one or more second solder joints attaching the electrical contacts of the second electronic component to the second electrical contacts of the PCB;
 where the electrical contacts of the second electronic component comprise electrically conductive solder balls having a higher melting point temperature than the second solder; and where the method further comprises performing the following steps before positioning the second solder in contact with one or more electrical contacts of the second electronic component and one or more mating second electrical contacts of the PCB:
  positioning the electrically conductive solder balls in contact with the electrical contacts of the second electronic component and heating the electrically conductive solder balls to a third temperature to reflow the solder balls, and
  then allowing the reflowed solder balls to cool to attach the solder balls to the electrical contacts of the second electronic component,
  where the second temperature is less than the melting point temperature of the solder of the solder balls;
 where the positioning the second solder in contact with the one or more electrical contacts of the second electronic component and the one or more mating second electrical contacts of the PCB comprises positioning the second solder between the reflowed solder balls and the one or more mating second electrical contacts of the PCB;
 where the heating the second solder to a second temperature that is lower than the first temperature comprises heating the second solder to the second temperature without reflowing the solder balls; and
 where the allowing the reflowed second solder to cool to form the one or more second solder joints attaching the electrical contacts of the second electronic component to the second electrical contacts of the PCB comprises allowing the reflowed second solder to cool to form hybrid solder joints that attach the electrical contacts of the second electronic component to the mating second electrical contacts of the PCB.

2. A method, comprising:
 positioning a first solder between and in contact with one or more electrical contacts of a first electronic component and one or more mating first electrical contacts of a printed circuit board (PCB);
 then heating the first solder to a first temperature to reflow the first solder;
 then allowing the reflowed first solder to cool to form one or more first solder joints attaching the electrical contacts of the first electronic component to the first electrical contacts of the PCB;
 then positioning a second solder in contact with one or more electrical contacts of a second electronic component and one or more mating second electrical contacts of the PCB;
 then heating the second solder to a second temperature that is lower than the first temperature to reflow the second solder without reflowing the first solder joints;

then allowing the reflowed second solder to cool to form one or more second solder joints attaching the electrical contacts of the second electronic component to the second electrical contacts of the PCB;
where the first and second mating electrical contacts are disposed on a first side of the PCB; and where the method further comprises:
positioning the first solder between and in contact with the one or more electrical contacts of the first electronic component and the one or more mating first electrical contacts disposed on the first side of the printed circuit board (PCB),
then heating the first solder to the first temperature to reflow the first solder,
then allowing the reflowed first solder to cool to form the one or more first solder joints attaching the electrical contacts of the first electronic component to the first electrical contacts disposed on the first side of the PCB,
then positioning the second solder in contact with the one or more electrical contacts of the second electronic component and the one or more mating second electrical contacts disposed on the first side of the PCB,
then heating the second solder to the second temperature that is lower than the first temperature to reflow the second solder without reflowing the first solder joints, and
then allowing the reflowed second solder to cool to form the one or more second solder joints attaching the electrical contacts of the first electronic component to the second electrical contacts disposed on the first side of the PCB,
where the electrical contacts of the second electronic component comprise electrically conductive solder balls that have a higher melting point temperature than the melting point temperature of the second solder to form hybrid solder joints that attach the electrical contacts of the second electronic component to the second electrical contacts of the PCB.

3. A method, comprising:
positioning a first solder between and in contact with one or more electrical contacts of a first electronic component and one or more mating first electrical contacts of a printed circuit board (PCB);
then heating the first solder to a first temperature to reflow the first solder;
then allowing the reflowed first solder to cool to form one or more first solder joints attaching the electrical contacts of the first electronic component to the first electrical contacts of the PCB;
then positioning a second solder in contact with one or more electrical contacts of a second electronic component and one or more mating second electrical contacts of the PCB;
then heating the second solder to a second temperature that is lower than the first temperature to reflow the second solder without reflowing the first solder joints;
then allowing the reflowed second solder to cool to form one or more second solder joints attaching the electrical contacts of the second electronic component to the second electrical contacts of the PCB;
where the mating first electrical contacts and the mating second electrical contacts are disposed on a first side of the PCB; and where the method further comprises:
positioning the first solder between and in contact with one or more electrical contacts of the first electronic component and the one or more mating first electrical contacts disposed on the first side of the PCB;
then heating the first solder to the first temperature to reflow the first solder;
then allowing the reflowed first solder to cool to form the one or more first solder joints attaching the electrical contacts of the first electronic component to the first electrical contacts disposed on the first side of the PCB;
then positioning a third solder between and in contact with one or more electrical contacts of a third electronic component and one or more mating third electrical contacts disposed on a second side of the PCB that is opposite from the first side of the PCB;
then heating the third solder to a third temperature to reflow the third solder;
then allowing the reflowed third solder to cool to form one or more third solder joints attaching the electrical contacts of the third electronic component to the third electrical contacts disposed on the second side of the PCB;
then positioning the second solder in contact with the one or more electrical contacts of the second electronic component and the one or more mating second electrical contacts disposed on the first side of the PCB;
then heating the second solder to the second temperature to reflow the second solder without reflowing the first and third solder joints, the second temperature being lower than the third temperature; and
then allowing the reflowed second solder to cool to form one or more second solder joints attaching the electrical contacts of the second electronic component to the second electrical contacts disposed on the first side of the PCB.

4. The method of claim 3, where the first solder is at least one of SAC 305, SAC 205, SAC 187, SAC 307, SAC 405, or SnPb 63/37; where the third solder is at least one of SAC 305, SAC 205, SAC 187, SAC 307, SAC 405, or SnPb 63/37; and where the second solder is at least one of Sn—Bi—Ag, Cu, Sn—Zn alloy, or Sn—In alloy.

5. The method of claim 3, where the third solder is the same type of solder as the first solder.

6. The method of claim 5, where each of the first solder and the third solder is SAC 305 solder; and where the second solder is at least one of Sn—Bi—Ag, Cu, Sn—Zn alloy, or Sn—In alloy.

7. The method of claim 3, where the first temperature is greater than or equal 220° C.; where the third temperature is greater than or equal 220° C.; and where the second temperature is less than 200° C.

8. The method of claim 1, where the first solder is at least one of wire solder, ingot solder, or paste solder; and where the second solder is at least one of wire solder, ingot solder, or paste solder.

9. The method of claim 1, where the first solder has a first melting point temperature; where the second solder has a second point temperature that is below the first melting point temperature of the first solder; and where:
the then heating the first solder to a first temperature to reflow the first solder comprises then heating the first solder to a temperature above the first melting point temperature to reflow the first solder while it is in simultaneous contact with the electrical contacts of the first electronic component and the mating first electrical contacts of the printed circuit board (PCB);

the then allowing the reflowed first solder to cool to form one or more first solder joints attaching the electrical contacts of the first electronic component to the first electrical contacts of the PCB comprises then allowing the reflowed first solder to cool to form the one or more first solder joints between the first electrical contacts of the first electronic component and the mating first electrical contacts of the PCB to attach the electrical contacts of the first electronic component to the first electrical contacts of the PCB;

the then heating the second solder to a second temperature that is lower than the first temperature to reflow the second solder without reflowing the first solder joints comprises then heating the second solder to a temperature above the second melting point temperature and below the first melting point temperature to reflow the second solder without reflowing the first solder joints, and while the second solder is in simultaneous contact with the electrical contacts of the second electronic component and the mating second electrical contacts of the PCB; and the then allowing the reflowed second solder to cool to form one or more second solder joints attaching the electrical contacts of the second electronic component to the second electrical contacts of the PCB comprises then allowing the reflowed second solder to cool to form the one or more second solder joints between the electrical contacts of the second electronic component and the mating second electrical contacts of the PCB to attach the electrical contacts of the second electronic component to the second electrical contacts of the PCB.

10. The method of claim 1,
where the one or more first solder joints formed to attach the electrical contacts of the first electronic component to the first electrical contacts of the PCB are disposed between the electrical contacts of the first electronic component and the mating first electrical contacts of the PCB, the first solder joints comprising a first solder having a first melting point temperature; and
where the one or more second solder joints formed to attach the electrical contacts of the second electronic component to the second electrical contacts of the PCB are disposed between the electrical contacts of the second circuit component and the mating second electrical contacts of the PCB, the second solder joints comprising a second solder having a second melting point temperature that is less than the first melting point temperature of the first solder.

11. The method of claim 10, where the first solder is at least one of SAC 305, SAC 205, SAC 187, SAC 307, SAC 405, or SnPb 63/37; and where the second solder is at least one of Sn—Bi—Ag, Cu, Sn—Zn alloy, or Sn—In alloy.

12. A method, comprising:
positioning a first solder between and in contact with one or more electrical contacts of a first electronic component and one or more mating first electrical contacts of a printed circuit board (PCB);
then heating the first solder to a first temperature to reflow the first solder;
then allowing the reflowed first solder to cool to form one or more first solder joints attaching the electrical contacts of the first electronic component to the first electrical contacts of the PCB;
then positioning a second solder in contact with one or more electrical contacts of a second electronic component and one or more mating second electrical contacts of the PCB;
then heating the second solder to a second temperature that is lower than the first temperature to reflow the second solder without reflowing the first solder joints;
then allowing the reflowed second solder to cool to form one or more second solder joints attaching the electrical contacts of the second electronic component to the second electrical contacts of the PCB;
where the one or more first solder joints formed to attach the electrical contacts of the first electronic component to the first electrical contacts of the PCB are disposed between the electrical contacts of the first electronic component and the mating first electrical contacts of the PCB, the first solder joints comprising a first solder having a first melting point temperature; and
where the one or more second solder joints formed to attach the electrical contacts of the second electronic component to the second electrical contacts of the PCB are disposed between the electrical contacts of the second circuit component and the mating second electrical contacts of the PCB, the second solder joints comprising a second solder having a second melting point temperature that is less than the first melting point temperature of the first solder; and
where the electrical contacts of the PCB comprise electrically conductive pads; where the electrical contacts of the second electronic component comprise electrically conductive solder balls; and where the second solder comprises a solder paste; and
where the electrically conductive solder balls of the electrical contacts of the second electronic component have a higher melting point temperature than the melting point temperature of the second solder to form hybrid solder joints that attach the electrical contacts of the second electronic component to the second electrical contacts of the PCB.

13. A method, comprising:
positioning a first solder between and in contact with one or more electrical contacts of a first electronic component and one or more mating first electrical contacts of a printed circuit board (PCB);
then heating the first solder to a first temperature to reflow the first solder;
then allowing the reflowed first solder to cool to form one or more first solder joints attaching the electrical contacts of the first electronic component to the first electrical contacts of the PCB;
then positioning a second solder in contact with one or more electrical contacts of a second electronic component and one or more mating second electrical contacts of the PCB;
then heating the second solder to a second temperature that is lower than the first temperature to reflow the second solder without reflowing the first solder joints;
then allowing the reflowed second solder to cool to form one or more second solder joints attaching the electrical contacts of the second electronic component to the second electrical contacts of the PCB;
where the one or more first solder joints formed to attach the electrical contacts of the first electronic component to the first electrical contacts of the PCB are disposed between the electrical contacts of the first electronic component and the mating first electrical contacts of the PCB, the first solder joints comprising a first solder having a first melting point temperature; and
where the one or more second solder joints formed to attach the electrical contacts of the second electronic component to the second electrical contacts of the PCB are disposed between the electrical contacts of the second circuit component and the mating second electrical contacts of the PCB, the second solder joints comprising a second solder having a second melting point temperature that is less than the first melting point temperature of the first solder; and where the electrical contacts of the second electronic component comprise electrically conductive solder balls that have a higher melting point temperature than the melting point temperature of the second solder to form hybrid solder joints that attach the electrical contacts of the second electronic component to the second electrical contacts of the PCB.

14. The method of claim 10, further comprising:
attaching one or more electrical contacts of a third electronic component to one or more mating third electrical contacts of the PCB by forming one or more respective third solder joints disposed between the electrical contacts of the third circuit component and the mating third electrical contacts of the PCB, the third solder joints comprising a third solder having a third melting point temperature that is less than the first melting point temperature of the first solder and the second melting point temperature of the second solder.

15. The method of claim 10, where the first and second mating electrical contacts are disposed on a same common side of the PCB.

16. The method of claim 3, where the third solder has a third melting point temperature that is greater than the second melting point temperature of the second solder.

17. The method of claim 16, where the first solder is at least one of SAC 305, SAC 205, SAC 187, SAC 307, SAC 405, or SnPb 63/37; where the third solder is at least one of SAC 305, SAC 205, SAC 187, SAC 307, SAC 405, or SnPb 63/37; and where the second solder is at least one of Sn—Bi—Ag, Cu, Sn—Zn alloy, or Sn—In alloy.

18. The method of claim 16, where the third melting point temperature of the third solder is the same as the first melting point temperature of the first solder.

19. The method of claim 1, where the electrically conductive solder balls comprises SAC 305 solder, and where the second solder comprises at least one of Sn—Bi—Ag, Cu, Sn—Zn alloy, or Sn—In alloy.

20. The method of claim 1, where the first solder is at least one of SAC 305, SAC 205, SAC 187, SAC 307, SAC 405, or SnPb 63/37; and where the second solder is at least one of Sn—Bi—Ag, Cu, Sn—Zn alloy, or Sn—In alloy.

21. The method of claim 1, where the first temperature is greater than or equal 220° C.; and where the second temperature is less than 200° C.

22. The method of claim 1, where the electrical contacts of the PCB comprise electrically conductive pads; where the electrical contacts of the second electronic component comprise at least one of electrically conductive solder balls or electrically-conductive leads; and where the second solder comprises a solder paste.

23. The method of claim 2, further comprising:
then positioning a third solder in contact with one or more electrical contacts of a third electronic component and one or more mating third electrical contacts of the PCB;
then heating the third solder to a third temperature that is lower than the first and second temperatures to reflow the third solder without reflowing the first and second solder joints; and
then allowing the reflowed third solder to cool to form one or more third solder joints attaching the electrical contacts of the third electronic component to the third electrical contacts of the PCB.

* * * * *